United States Patent
Otsuka et al.

(10) Patent No.: US 9,087,761 B2
(45) Date of Patent: Jul. 21, 2015

(54) SOLID-STATE IMAGING DEVICE INCLUDING AN ON-CHIP LENS WITH TWO INORGANIC FILMS THEREON

(75) Inventors: Yoichi Otsuka, Kanagawa (JP); Akiko Ogino, Kumamoto (JP); Kiyotaka Tabuchi, Kumamoto (JP); Takamasa Tanikuni, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 69 days.

(21) Appl. No.: 13/248,491

(22) Filed: Sep. 29, 2011

(65) Prior Publication Data
US 2012/0086093 A1  Apr. 12, 2012

(30) Foreign Application Priority Data

Oct. 7, 2010  (JP) .................................. 2010-227755

(51) Int. Cl.
*H01L 31/0232* (2014.01)
*H01L 27/146* (2006.01)
*H01L 27/148* (2006.01)
*H04N 9/04* (2006.01)

(52) U.S. Cl.
CPC .... *H01L 27/14685* (2013.01); *H01L 27/14621* (2013.01); *H01L 27/14627* (2013.01); *H01L 27/14818* (2013.01); *H01L 27/14843* (2013.01); *H04N 9/045* (2013.01)

(58) Field of Classification Search
CPC ................ H01L 31/0232; H01L 31/18; H01L 27/14621; H01L 27/14627; H01L 27/14685; H01L 27/14818; H01L 27/14843
USPC .................................................. 257/432–437
See application file for complete search history.

(56) References Cited

U.S. PATENT DOCUMENTS

| | | | | |
|---|---|---|---|---|
| 2001/0051405 | A1* | 12/2001 | Sekine | 438/208 |
| 2006/0076636 | A1* | 4/2006 | Fukunaga | 257/432 |
| 2009/0224347 | A1* | 9/2009 | Kim et al. | 257/432 |
| 2009/0280596 | A1* | 11/2009 | Akiyama | 438/70 |
| 2012/0018832 | A1* | 1/2012 | Cooney et al. | 257/432 |

FOREIGN PATENT DOCUMENTS

| | | |
|---|---|---|
| JP | 04-223371 | 8/1992 |
| JP | 3166199 | 3/2001 |

* cited by examiner

*Primary Examiner* — Thanh T Nguyen
(74) *Attorney, Agent, or Firm* — Dentons US LLP

(57) ABSTRACT

A solid-state imaging device includes a plurality of pixels formed on a semiconductor substrate and include a photoelectric conversion unit; a color filter on the pixels; an on-chip microlens made of an organic film on the color filter, corresponding to each of the pixels; a first inorganic film formed on a surface of the on-chip microlens and having a higher refraction index than the on-chip microlens; and a second inorganic film formed on a surface of the first inorganic film and having a lower refraction index than the on-chip microlens and the first inorganic film, in which at least the second inorganic film includes a non-lens area at an interface of an adjacent second inorganic film.

10 Claims, 16 Drawing Sheets a-b CROSS-SECTION  b-c CROSS-SECTION a-b CROSS-SECTION  b-c CROSS-SECTION

SOLID-STATE IMAGING DEVICE INCLUDING AN ON-CHIP LENS WITH TWO INORGANIC FILMS THEREON

BACKGROUND

The present disclosure relates to a solid-state imaging device, a method of manufacturing the solid-state imaging device, and an electronic apparatus equipped with a solid-state imaging device, such as a camera.

A CMOS solid-state imaging device or a CCD solid-state imaging device has been proposed as a solid-state imaging device (an image sensor). The solid-state imaging device has been used for a digital camera, a digital video camera, and various portable terminals, such as a camera-mounted mobile phone. The CMOS solid-state imaging device has a power source voltage lower than the CCD solid-state imaging device and is advantageous in view of power consumption.

The CMOS solid-state imaging device has a configuration in which a unit pixel is formed by a photodiode (photoelectric conversion unit) that is a light receiving section and a plurality of pixel transistors and a plurality of pixels are 2-dimensionally arranged. The plurality of pixel transistors is generally composed of four transistors, that is, a transfer transistor, an amplification transistor, a reset transistor, and a selection transistor, or three transistors without the selection transistor. Alternatively, the pixel transistors may be shared by a plurality of diodes. Further, the terminals of the transistors are connected to a multilayered-wire to read out a signal current by applying a desired pulse voltage to the plurality of pixel transistors.

The CCD solid-state imaging device includes a plurality of 2-dimensionally arranged photodiodes that are a light receiving section, vertical transfer resistors having a CCD structure and disposed in the lines of the light receiving sections, respectively, and horizontal transfer resistors having a CCD structure and disposed in the ends of the vertical transfer resistors, and output units of the horizontal transfer resistors.

In the solid-state imaging device, in order to improve the sensitivity characteristic, an on-chip microlens (hereafter, abbreviated as a microlens) on a color filter corresponding to each of the pixels is formed and incident light is condensed to the photodiode by the microlens.

A melt flow process or an etch back process may be used as a method of manufacturing the microlens. The melt flow process is a method of forming a microlens by patterning a material for the microlens which is a photosensitive resistor and performing a reflow process on the material for the microlens formed at each pixel by heat. The etch back process is a method of forming a microlens by forming a lens shape by a photosensitive resistor on a layer of a material for the lens, performing the etch back process in dry etching, and transferring the lens shape onto the material for the lens.

On the other hand, a technology of forming an antireflection coating in a single film or a multi-film on the outer surface of a microlens disposed on a pixel of a solid-state imaging device has been disclosed in Japanese Unexamined Patent Application Publication No. 4-223371. For example, in an antireflection coating implemented by a two-layered film, a first-layer film and a second-layer film are sequentially stacked on the outer surface of the microlens and refraction indexes are set to be lower in order of the first-layer film and the second-layer film from the microlens. That is, the magnitude relationship of the refraction index is microlens>first-layer film>second-layer film. By the configuration of sequentially increasing the refraction index from the second-layer film to the microlens, a change in the refraction index between the air and the microlens becomes small, such that reflection of incident light is prevented. A flare (ghost) caused by reflection is suppressed by the antireflection coating such that the sensitivity characteristic is improved.

A technology of enlarging a lens system and improving a luminosity sensitivity characteristic by forming a microlens cover film that substantially narrows a gap between microlenses on a surface including the microlenses disposed on pixels of a solid-state imaging device has been introduced in Japanese Patent No. 3166199. It is difficult to design the focus of the lens when the difference in refraction index between the microlens and the microlens cover film is large. Therefore, when the refraction index of the microlens is 1.6 to 1.7, it is preferable to use an SiON film having a refraction index of 1.6 to 1.8 as the microlens cover film. On the other hand, it is possible to achieve reduction of chromatic aberration by actively using the difference in refraction index. Further, an antireflection coating may be disposed on the surface of the microlens cover film.

SUMMARY

Since there is a problem of a ghost caused by surface reflection of a microlens in a camera system using a solid-state imaging device, it is preferable to increase the quality of an image by decreasing the ghost. In Japanese Unexamined Patent Application Publication No. 4-223371, surface reflection of a microlens is suppressed by disposing an antireflection coating on the surface of the microlens. In this case, however, since reflection is suppressed by reducing the difference in refraction index, a light component that reflects from the surfaces of the microlens, the first-layer film, and the second-layer film exists, such that there is a limit in suppressing a ghost.

A mechanism in which a ghost is generated is described by using FIG. 20. For example, a solid-state imaging device 1 in which a microlens 3 is formed on a color filter 2 with an RGB Bayer array is disposed in a package (not shown). An infrared cutoff filter 4 is disposed at the upper portion of the package and a camera lens 5 is disposed at a more upper portion. The camera lens is a schematically flat. Incident light L traveling through the camera lens reaches the solid-state imaging device 1 through the infrared cutoff filter 4. In this case, when a light reflection type infrared cutoff filter implemented by an inorganic interference multilayer film is used for the infrared cutoff filter 4, a ghost is generated in a color image by the filter in some cases.

In detail, incident light L including red light, green light, and blue light components passing through the members used in the camera set, such as the infrared cutoff filter 4, the camera lens 5, and the inside of the lens barrel, reflects from the surface of the microlens 3 and reflects again from the infrared cutoff filter 4, and then travels into another pixel. In particular, in colored light of the primary three colors, the red light Lr having the largest wavelength reflects from the light reflection type infrared cutoff filter 4, unlike other colored light, such that a so-called ghost of a red component is generated in an image.

On the other hand, the green light or the blue light may reflect from members other than the infrared cutoff filter, for example, the camera lens (Lg and Lb) and travel into another pixel, such that a so-called ghost of a green component or ghost of a blue component is generated in an image.

Polystyrene-based resin, or acryl-based resin, or copolymer-based resin of the resin is used for the microlens of the solid-state imaging device. The surface light reflectance is about 5.5 to 4.1%. Therefore, incident light reflects from the microlens to the solid-state imaging device, which is a factor causing generation of ghost.

Therefore, it is necessary to reduce a ghost generated in an image or suppress antireflection of the colors and improve color reproductivity by more effectively reducing a reflectance of the surface of the microlens, for visible light including the red light or the blue light, in addition the to red light.

Further, it is necessary to simplify the configuration of enlarging the lens area by narrowing the gap between the microlenses, in addition to the antireflection.

In the melt flow process, process conditions (usually, the heating type, heating temperature, heating time and the like) that narrow the gap to be as small as possible in a lens tri-flow process by heat are set to reduce the gap between the microlenses. However, when a small variation is generated in various process conditions, the microlens is fused to the adjacent pixel, such that the lens shape is changed and the light condensing function of the microlens is deteriorated.

Further, it is necessary to generally decrease the thickness of the cross-sectional structure to improve the sensitivity characteristic that is an important characteristic of a solid-state imaging device. It is necessary to decrease the size of the color filter cover film formed on the color filter to decrease the thickness. Acryl thermoplastic resin is very suitable for a material film used to decrease the thickness of the color filter. The surface of the acryl thermoplastic resin is corrugated in a concave-convex shape in accordance with the steps (concave and convex) of the color filter right after spin coating, but the surface is thermally fused and substantially planarized by heat treatment and the thickness is decreased.

When a microlens is formed by the melt flow process on the color filter cover film of which the thickness is decreased by planarizing the surface, a portion of the color filter cover film is exposed between the microlenses. In this state, when an antireflection coating, for example, implemented by an SiN film is formed on the microlens surface, the acryl-based thermoplastic resin that is the color filter cover film may not stand the SiN film stress and is caused to undergo an extension/retraction phenomenon. It was found that "corrugation" is generated on the SiN film together with the acryl-based thermoplastic resin by the extension/retraction phenomenon. Therefore, it is preferable to prevent the corrugation from being generated without detracting from the antireflection effect.

It is desirable to provide a solid-state imaging device that increases the quality of an image, further expands an effective area of a microlens, and improves sensitivity characteristic by further decreasing the generation of a ghost due to at least surface reflection of the microlens, and a method of manufacturing the solid-state imaging device, in consideration of the problems.

Further, It is desirable to provide a solid-state imaging device that prevents the generation of corrugation of an antireflection coating and a color filter cover film and a method of manufacturing the solid-state imaging device.

It is desirable to provide an electronic apparatus equipped with the solid-state imaging device, such as a camera.

A solid-state imaging device according to an embodiment of the present disclosure includes a plurality of pixels formed on a semiconductor substrate and include a photoelectric conversion unit, a color filter on the pixels, and an on-chip microlens made of an organic film on the color filter, corresponding to each of the pixels. Further, the solid-state imaging device includes a first inorganic film formed on a surface of the on-chip microlens and having a higher refraction index than the on-chip microlens and a second inorganic film formed on a surface of the first inorganic film and having a lower refraction index than the on-chip microlens and the first inorganic film. In this configuration, at least the second inorganic film includes a non-lens area at an interface of an adjacent second inorganic film.

In the solid-state imaging device of the disclosure, an antireflection coating of the surface of the on-chip microlens is formed by two-layered films of the first and second inorganic films. Further, the first inorganic film has a higher refraction index than the on-chip microlens and the second inorganic film has a lower refraction index than the on-chip microlens and the first inorganic film. Therefore, it is possible to substantially remove reflection by reducing reflection from the surface of the on-chip microlens as less as possible by using interference of the light reflecting from the surface of the on-chip microlens and the light reflecting from the first and second inorganic films. Further, since at least the second inorganic films are formed without a non-lens area at the interface of adjacent second inorganic films, the substantial lens area, that is, the effect area of the on-chip microlens is enlarged. That is, in the present disclosure, the configuration is simplified by using the antireflection coating formed of a two-layered film, such that it is possible to further prevent reflection and enlarge the effective area of the on-chip microlens.

A method of manufacturing a solid-state imaging device according to another embodiment of the present disclosure includes forming a plurality of pixels composed of a photoelectric conversion unit and a unit that reads out signal charges of the photoelectric conversion unit on a semiconductor substrate and forming a color filter corresponding to the pixel. Next, the method includes forming an on-chip microlens made of an organic film on the color filter, corresponding to the pixel. Next, the method includes forming a first inorganic film having a higher refraction index than the on-chip microlens, on the surface of the on-chip microlens. Next, the method includes forming a second inorganic film having a lower refraction index than the on-chip microlens and the first inorganic film, on the surfaces of the first inorganic film such that a non-lens area does not exist at the interface of adjacent second inorganic films.

In the method of manufacturing a solid-state imaging device of the present disclosure, since the first and second inorganic films which have the refraction index conditions are formed on the surface of the on-chip microlens, it is possible to form an antireflection coating that can reduce reflection from the surface of the on-chip microlens as less as possible and substantially remove the reflection. Since the second inorganic film is formed such that a non-lens area does not exist at the interface of adjacent second inorganic films, an on-chip microlens of which the substantial lens area is enlarged is formed.

An electronic apparatus according to still another embodiment of the present disclosure includes a solid-state imaging device, an optical system that introduces incident light to a photoelectric conversion unit of the solid-state imaging device, and a signal processing circuit that processes an output signal of the solid-state imaging device. The solid-state imaging device includes a plurality of pixels that are formed on a semiconductor substrate and include a photoelectric conversion unit and a unit reading out signal charges of the photoelectric conversion unit, color filters on the pixels, and on-chip microlenses that are made of an organic film on the color filter, corresponding to the pixels. Further, the solid-state imaging device includes first inorganic films that are formed on the surface of the on-chip microlenses and have a higher refraction index than the on-chip microlenses and second inorganic films that are formed on the surfaces of the first inorganic films and have a lower refraction index than the on-chip microlens and the first inorganic film. In this configuration, at least the second inorganic films are formed without a non-lens area at the interface of adjacent second inorganic films.

In the electronic apparatus of the present disclosure, since the solid-state imaging device is included, it is possible to reduce reflection from the surface of the on-chip microlens as less as possible and substantially remove the reflection and it is possible to enlarge the substantial lens area of the on-chip microlens.

According to the solid-state imaging device according to the embodiment the present disclosure, since it is possible to reduce light reflection from the surface of the on-chip microlens by interference of reflecting light as less as possible, it is possible to achieve a high-quality image by further reducing the generation of a ghost due to surface reflection of the microlens. Since the effective area of the microlens is enlarged, it is possible to improve the sensitivity characteristic.

According to a method of manufacturing a solid-state imaging device of the embodiment of the present disclosure, it is possible to manufacture a solid-state imaging device that can achieve a high-quality image by further reducing the generation of a ghost due to surface reflection of the microlens and further improve the sensitivity characteristic.

According to an electronic apparatus of the embodiment of the present disclosure, in a solid-state imaging device, a high-sensitivity and good-quality image is achieved, such that it is possible to provide a high-quality electronic apparatus.

DETAILED DESCRIPTION OF EMBODIMENTS

Hereinafter, embodiments for implementing the present disclosure (hereafter, referred to as embodiments) are described. Further, the description is provided in the following order.

1. First Embodiment (Example of Manufacturing Method as Configuration Example of Solid-state imaging device)
2. Second Embodiment (Example of Manufacturing Method as Configuration Example of Solid-state imaging device)
3. Third Embodiment (Example of Manufacturing Method as Configuration Example of Solid-state imaging device)
4. Fourth Embodiment (Example of Manufacturing Method as Configuration Example of Solid-state imaging device)
5. Fifth Embodiment (Example of Manufacturing Method as Configuration Example of Solid-state imaging device)
6. Sixth Embodiment (Example of Manufacturing Method as Configuration Example of Solid-state imaging device)
7. Seventh Embodiment (Example of Manufacturing Method as Configuration Example of Solid-state imaging device)
8. Eighth Embodiment (Configuration Example of Electronic apparatus)

1. First Embodiment

[Configuration Example of Solid-State Imaging Device]

Figure 1:
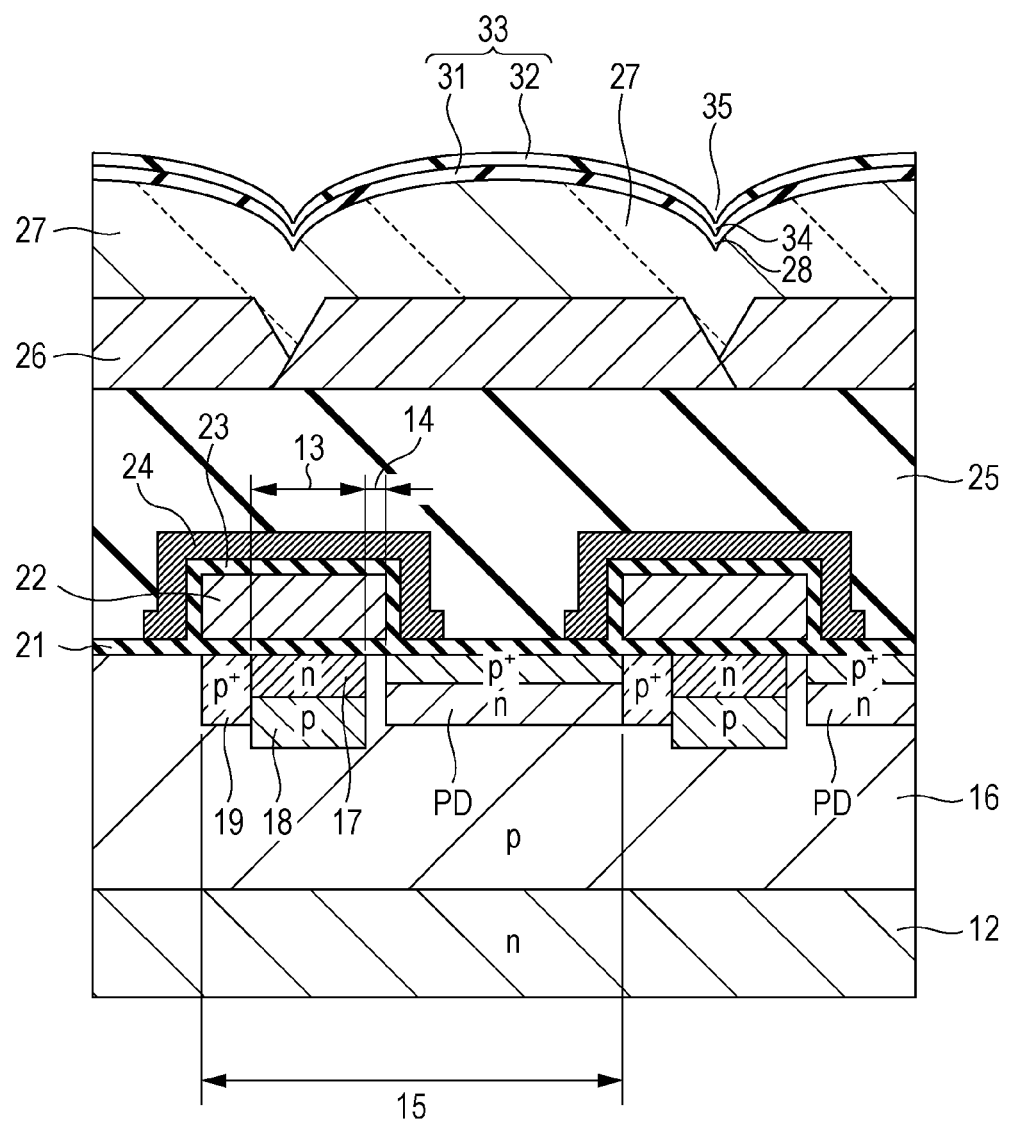
FIG. 1 is a schematic configuration view of the main parts which shows a first embodiment of a solid-state imaging device according to the present disclosure.

FIG. 1 shows a first embodiment of a solid-state imaging device according to the present disclosure. The embodiment exemplifies a CCD solid-state imaging device. FIG. 1 shows a schematic cross-sectional structure of the main parts including a photoelectric conversion unit (photodiode) that is a light receiving section and a vertical transfer resistor. A solid-state imaging device 11 according to the first embodiment includes a vertical transfer resistor 13 having a CCD structure that reads out signal charges of photodiodes PDs, corresponding to each line of light receiving sections, in which photoelectric conversion units that are a plurality of light receiving sections, for example, the photodiodes PDs are 2-dimensionally arranged, on a semiconductor substrate 12. The semiconductor substrate 12 may be implemented by using a silicon substrate, for example. Signal charges read out from the photodiodes PDs are vertically transferred to the vertical transfer resistor 13. Further, though not shown, a horizontal transfer resistor having a CCD structure that horizontally transfers the signal charges from the vertical transfer resistor to the end of the vertical transmission resistor 13 and an output portion including a charge power conversion unit connected to the end of the horizontal transfer resistor are included.

A pixel 15 is composed of the photodiode PD and a signal charge reading-out portion of the photodiode PD, that is a transfer portion corresponding to the photodiode PD of the vertical transfer resistor 13, including the charge reading-out portion 14. The photodiode PD includes a second conductive type, for example, an n-type semiconductor area and a p-type semiconductor area suppressing dark current on the surface in a first conductive type, for example, a p-type first semiconductor well area 16 formed on the semiconductor substrate 12. A n-type embedded channel area 17 corresponding to each of the lines of the light receiving sections, a p-type second semiconductor well area 18 right under the embedded channel area 17, and a p-type channel stop area 19 separating pixels 15 are formed in the p-type first semiconductor well area 16. The charge reading-out portion 14 is formed between the photodiode PD and the vertical transfer resistor 13.

A gate insulating film 21 including the upper portion of the embedded channel area 17 is formed and a transfer electrode 22 having a width across the embedded channel area 17, the charge reading-out portion 14, and the channel stop area 19 is arranged along the transfer direction on the gate insulating film 21. The vertical transfer resistor 13 is formed by the embedded channel area 17, the gate insulating film 21, and a transfer electrode 22.

A light shield film 24 is formed through the insulating film 23 on the entire surface including the transfer electrode 22, except for a hole of the photodiode PD. Further, the insulating film 25 is formed on the entire surface, and a color filter 26 and an on-chip microlens (hereafter, abbreviated as a microlens) 27 corresponding to each pixel are stacked on the flat surface of the insulating film 25. For the color filter 26, for example, primary color-based color filters of green, red, and blue, or complementary color-based color filters of yellow, cyan, and magenta may be used. For example, a check-arranged primary color-based color filter may be used as the color filter 26.

Further, in the embodiment, the microlenses 27 are formed by an etch back process, without a non-lens area at the interface of vertically and horizontally adjacent microlenses 27, as is clear from the manufacturing process described below. That is, in the microlenses 27, the ends of adjacent microlenses 27 are in contact with each other, such that a V-shaped recess 28 is formed between the adjacent microlenses 27. An antireflection coating 33 having a two-layered film structure formed by stacking a first inorganic film 31 and a second inorganic film 32 is formed on the surface of the microlens 27.

The first inorganic film 31 of the antireflection coating 33 is made of material having a higher refraction index than the microlens 27 and the second inorganic film 32 is made of a material having a lower refraction index than the microlens 27 and the first inorganic film 31. That is, the refraction index relationship is the following.

First inorganic film 31>microlens 27>second inorganic film 32.

The microlens 27 is made of an organic film. The following materials may be used as the organic film. For example, inorganic film, such as acryl-based thermoset resin (refraction index of about 1.50), acryl-based thermoplastic resin (refraction index of about 1.50), styrene-based thermoset resin (refraction index of 1.61), styrene-based thermoset resin, or polymerization resin thereof (refraction index of about 1.51 to 1.60), may be used. The first inorganic film 31 may be formed of, for example, a silicon nitride (SiN) film (refraction index of about 1.81 to 1.90) or a silicon oxynitride (SiON) film (refraction index of about 1.52 to 1.80). The second inorganic film 32 may be formed of, for example, a silicon oxide (SiO) film (refraction index of about 1.47) or a silicon oxycarbide (SiOC) film (refraction index of about 1.40).

The first organic film 31 and the second organic film 32 are bonded along the curved surface of the microlens 27, without a non-lens area at the interface of the adjacent inorganic films. That is, in the first inorganic films 31, the ends of the adjacent first inorganic films 31 are in contact with each other and a V-shaped recess 34 is formed between the adjacent first inorganic films 31. Similarly, in the second inorganic films 32, the ends of the adjacent second inorganic films 32 are in contact with each other and a V-shaped recess 35 is formed between the adjacent second inorganic films 32.

As the antireflection coating 33 that prevents light from reflecting from the surface of the microlens 27, a configuration in which a silicon nitride (SiN) film having high refraction index may be used for the first inorganic film 31 while a silicon oxycarbide (SiOC) film and a silicon oxide (SiO) film having a low refraction index may be used for the second inorganic film 32 may be possible.

In view of the antireflection effect, the silicon oxycarbide (SiOC) film having a refraction index lower than the silicon oxide (SiO) film is preferable. As the second inorganic film 32, a silicon oxide (SiO) film may be used to simplify the process, although the antireflection effect is a little smaller than when the silicon oxycarbide (SiOC) film is used for the second inorganic film 32. The simplification of the process will be described. When the silicon oxycarbide (SiOC) film is used for the second inorganic film 32, the surface after a film is formed has a hydrophobic property because $CH_3$ groups exist on the surface when $SiH(CH_3)_3$ is used for a film forming gas, such that particles stick in a singulation process. In this case, when a SiOC film is used for the second inorganic film 32, it is necessary to make the surface hydrophilic by applying a plasma process (light ashing) on the surface by using an oxygen gas or the like before cutting a wafer. On the other hand, since the silicon oxide (SiO) film has hydrophilicity, a plasma process for making the film hydrophilic is not necessary, thereby simplifying the process. The second inorganic film is freely selected in view of the antireflection effect or the simplification of the process.

Further, when a silicon nitride film is used at least for the first inorganic film 31, the antireflection effect due to interference of reflecting light from each surface is excellent. Meanwhile, it was inspected whether "corrugation" was generated when the microlens 27 was made of acryl-based thermoplastic resin and the first inorganic film 31 was formed of a silicon nitride film. As a result it was found that "corrugation" was not generated that is observed in forming a silicon nitride film that is the first inorganic film 31 was not generated, when the film thickness of the silicon nitride film that is the first inorganic film 31 was 450 nm or less, preferably 400 nm or less. It was found that "corrugation" was generated that is observed in forming the first inorganic film 31, when the film thickness of the silicon nitride film that is the first inorganic film 31 was 500 nm or less. When acryl-based thermoplastic resin is used for the microlens and the antireflection coating is formed of a SiN film on the surface, the acryl-based thermoplastic resin that is the microlens being in contact with the SiN film may not stand film stress of the SiN film and undergoes an extension/retraction phenomenon. "Corrugation" is generated on the SiN film and the acryl-based thermoplastic resin film by the extension/retraction phenomenon. Accordingly, in the embodiment, when a thermoplastic resin film, such as acryl-based thermoplastic resin and a silicon nitride (SiN) film are selected as the materials of the microlens 27 and the first inorganic film 31, respectively, the film thickness of the first inorganic film 31 is set to 450 nm or less.

The microlens 27 may be formed of an acryl-based thermoplastic resin film and the first inorganic film 31 may be formed of a silicon oxynitride film having a lower refraction index than a silicon nitride film. In this case, it was found that the antireflection effect is slightly decreased, but "corrugation" is not generated on the first inorganic film 31 even if the film thickness of the first inorganic film is not set to be small, as described above.

According to the solid-state imaging device 11 of the first embodiment, the antireflection coating 33 composed of the first inorganic film 31 having a higher refraction index than the microlens 27 and the second inorganic film 32 having a lower refraction index than the microlens 27 and the first inorganic film 31 are formed on the surface of the microlens 27. The antireflection coating 33 uses an interference action between the light reflecting from the surface of the microlens 27, the light reflecting from the surface of the first inorganic film 31, and the light reflecting from the surface of the second inorganic film 32, and as a result, it is possible to reduce the light reflecting from the surface of the microlens 27 as much as possible and may substantially remove the reflecting light. Therefore, since it is possible to more reduce the ghost generated by surface reflection of the microlens 27, particularly, the actualized ghost of red light when applying the solid-state imaging device 11 to, for example, a camera set, it is possible to further improve the quality of an image.

A portion of microlens 27 is formed with the microlens 27 by the first and second inorganic films 31 and 32 in the antireflection coating 33 composed of the first and second inorganic films 31 and 32. Since the antireflection coatings 33 of the adjacent microlenses are in contact with each other and a non-lens area does not exist between the antireflection coatings 33, the substantially effective area of the microlens is enlarged and the sensitivity characteristic of the solid-state imaging device 11 can be improved. In the embodiment since it is possible to both reduce the cost and improve the sensitivity characteristic using the antireflection coating 33 having a two-layered film structure, it is possible to simplify the configuration.

When the microlens 27 is formed of a thermoplastic resin film, for example, made of acryl-based thermoplastic resin and the first inorganic film 31 of the antireflection coatings 33 is formed of a silicon nitride (SiN) film, the film thickness of the first inorganic film 31 is set to 450 nm or less. Therefore, it is possible to prevent corrugation from being generated on the first inorganic film 31 while achieving an excellent antireflection effect, such that it is possible to provide a high-quality solid-state imaging device. Further, when the microlens 27 is formed of a thermoplastic resin film, for example, made of acryl-based thermoplastic resin and the first inorganic film 31 is formed of a silicon oxynitride (SiON) film, it is possible to prevent generation of corrugation regardless of the film thickness of the first inorganic film 31 although the antireflection effect is slightly decreased. Therefore, it is also possible to provide a solid-state imaging device having a good quality without generating corrugation, as far as possible without detracting from the antireflection effect.

When a silicon nitride (SiN) film or a silicon oxynitride (SiON) is used for the antireflection coating 33, an oxygen blocking effect is improved, other than the antireflection effect. Therefore, light resistance of the microlens or the color filter cover film that is formed of an organic film is improved more than the antireflection coating formed of a single layer of silicon oxide (SiO) film on the microlens.

[Example of Method of Manufacturing Solid-State Imaging Device]

A method of manufacturing the solid-state imaging device 11 according to the first embodiment is shown in FIGS. 2 and 3. The structure formed under the color filter 26 is not shown in the figures.

First, though not shown, the photodiodes PD, the vertical transfer resistor 13, and the horizontal resistor are formed on the silicon semiconductor substrate 12, the imaging area where a plurality of pixels are 2-dimensionally arranges is formed by forming the light shield film 24, and the output portion is formed.

Figure 2A:
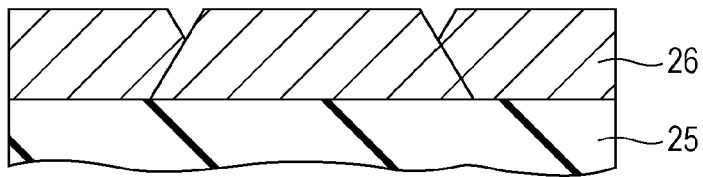
FIGS. 2A to 2D are manufacturing process diagrams (1) showing a method of manufacturing the solid-state imaging device according to the first embodiment.

Next, as shown in FIG. 2A, the insulating film 25 is formed on the entire surface and the color filter 26 is formed on the insulating film 25 by planarizing the surface of the insulating film 25. The color filter 26 may be a primary color-based filter of green red, and blue, or a complementary color-based filter of yellow, cyan, and magenta.

Figure 2B:
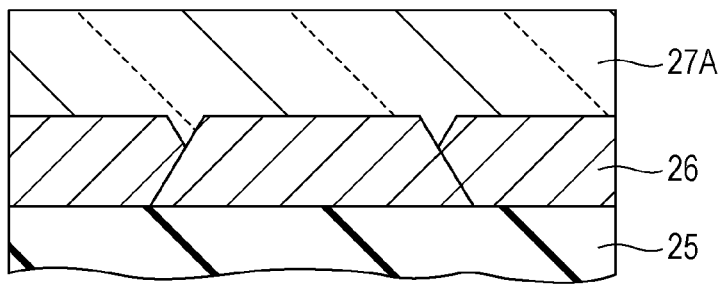

Next, a microlens material layer 27A is formed on an organic film on the color filter 26, as shown in FIG. 2B. The microlens material layer 27A is formed by applying polystyrene copolymer-based thermoset resin by spin coating and hardening the resin on a hot plate. Since the microlens is formed by the etch back process in the embodiment, the microlens may be formed by applying the microlens material layer 27A thick. Therefore, the microlens material layer 27A absorbs the concavity and convexity of the surface of the color filter 26, such that the surface is formed flat.

Figure 2C:
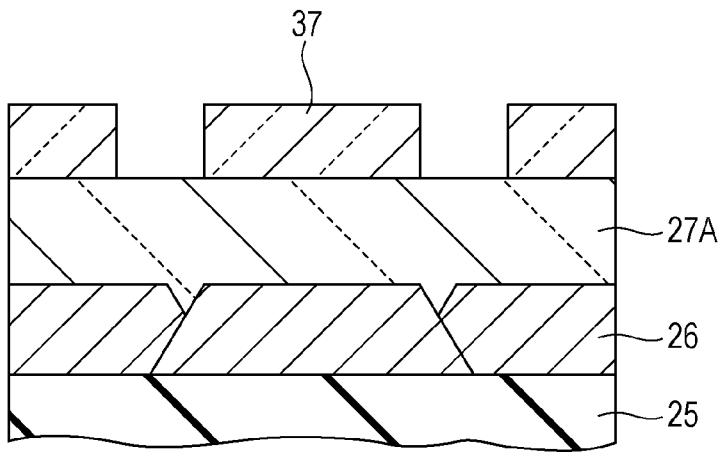

Next, a resistor layer 37 is formed on the microlens material layer 27A to correspond to each pixel, as shown in FIG. 2C. That is, a photosensitive resin film, for example, a positive photosensitive resin film is formed on the microlens material layer 27A and the resistor layer 37 is formed at a position corresponding to each pixel by patterning the photosensitive resin film with photolithography.

Figure 2D:
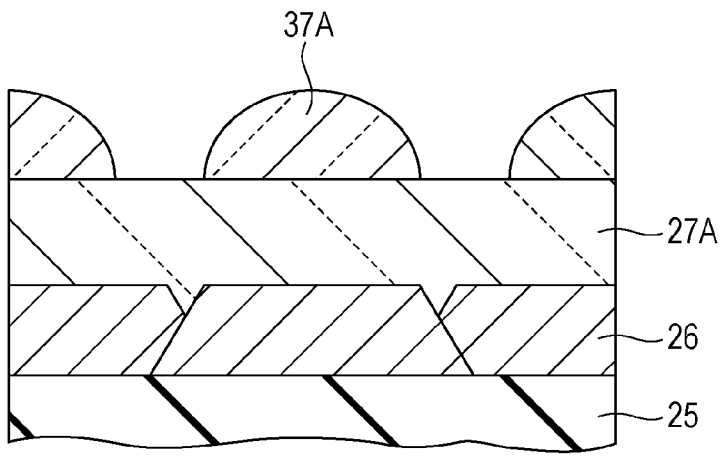

Next, as shown in FIG. 2D, a lens shape layer 37A having a concave curved surface at the upper portion is formed by heating the resistor layer 37 at a temperature higher than the thermal softening temperature. The lens shape layer 37A becomes an etching mask layer.

Figure 3A:
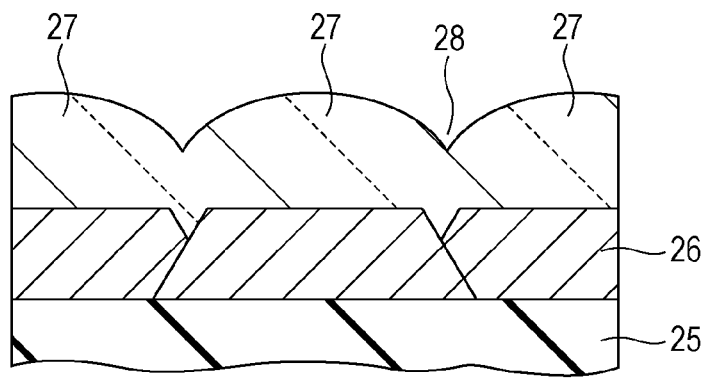
FIGS. 3A to 3C are manufacturing process diagrams (2) showing a method of manufacturing the solid-state imaging device according to the first embodiment.

Next, as shown in FIG. 3A, the microlens 27 is formed at a position corresponding to each pixel by transferring the lens shape of the lens shape layer 37A onto the microlens material layer 27A by applying an etch back process. The adjacent microlenses 26 are formed to have a V-shaped recess 28 between the microlenses with the lens end in contact with each other, without a non-lens area at the interface between the microlenses.

Figure 3B:
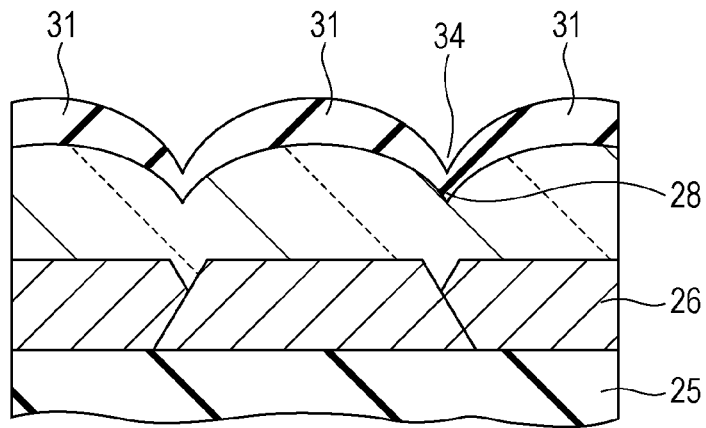

Next, as shown in FIG. 3B, the first inorganic film 31 is formed on the surface of the microlens 26. The first inorganic film 31 may be formed of, for example, a silicon nitride (SiN) film or a silicon oxynitride (SiON) film by using CVD (Chemical Vapor Deposition). In this case, it is preferable that the formation temperature of the first inorganic film 31 is 250° C. or less, in view of the heat resistance of the color filter 26 and the microlens 27 formed of various organic films. The first inorganic film 31 is formed in the shape of the surface of the microlens 27. Accordingly, the first inorganic films 31 on the adjacent microlenses 27 are formed to have a V-shaped recess 34 between the first inorganic films 31, with the ends in contact with each other, without a non-lens area at the interface between the first inorganic films 31.

Figure 3C:
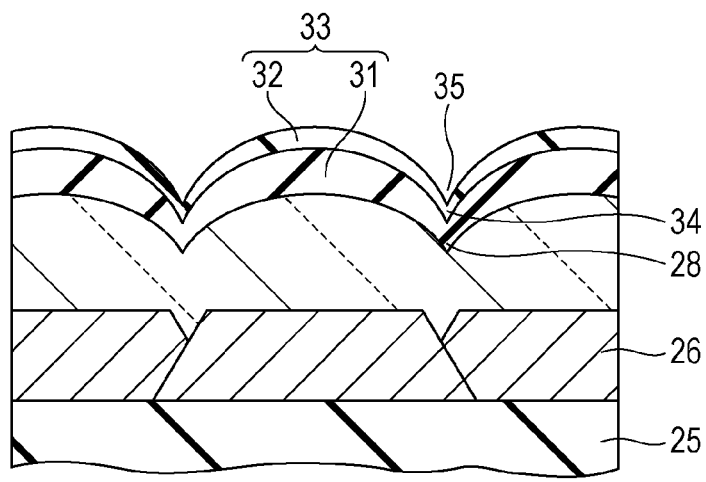

Next, as shown in FIG. 3C, the second inorganic film 32 is formed on the entire surface of the first inorganic film 31. The second inorganic film 32 may be formed of, for example, a silicon oxide (SiO) film or a silicon oxycarbide (SiOC) film by using plasma CVD (Chemical Vapor Deposition). In this case, it is preferable that the formation temperature of the second inorganic film 32 is 250° C. or less, in view heat resistance of the color filter 26 and the microlens 27 formed of various organic films. The second inorganic film 32 is formed in the shape of the surface of the first inorganic film 31. Accordingly, the second inorganic films 32 on the adjacent microlenses 27 are formed to have a V-shaped recess 35 between the second inorganic films 32, with the ends in contact with each other, without a non-lens area at the interface between the first inorganic films 32.

As a result, the desired solid-state imaging device 11 having the two-layered film composed of the first inorganic film 31 and the second inorganic film 32 on the surface of the microlens 27 is achieved.

Further, when acryl-based thermoplastic resin is selected for the microlens 27 and a silicon nitride film is selected for the first inorganic film 31, the film thickness of the first inorganic film 31 is set to 450 nm or less, preferably 400 nm or less. Further, as described above, acryl-based thermoplastic resin may be selected for the organic film of the microlens 27 and a silicon oxynitride film may be selected for the material film of the first inorganic film 31.

According to the method of manufacturing the solid-state imaging device 11 of the embodiment the microlens 27 is formed by the etch back process and the antireflection coating 33 having a two-layered film structure having the relationship of refraction index is formed on the surface of the microlens 27. Therefore, the generation of a ghost due to surface reflection of the microlens 27 is reduced, the effective area of the microlens 27 is enlarged, and it is possible to manufacture a solid-state imaging device that increases the quality of an image and improves the sensitivity characteristic.

Figure 4A:
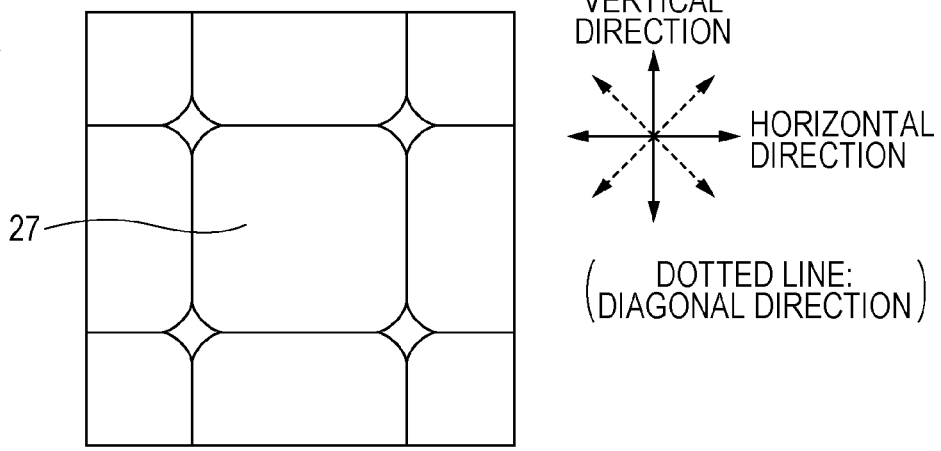
FIGS. 4A to 4C are plan views of a microlens according to a difference in the etch back amount in the process of FIG. 3A.
Figure 4B:
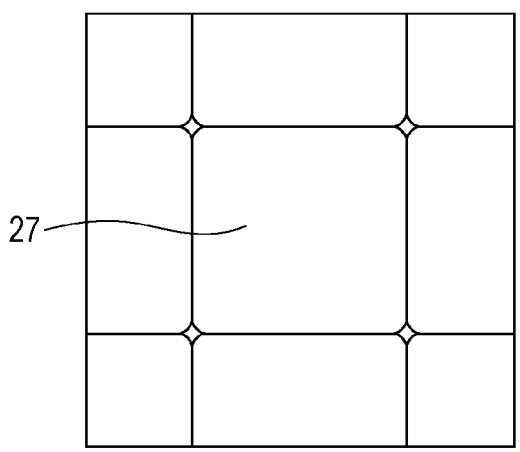

FIGS. 4A and 4B are plan views of the microlens 27 shown in the process of FIG. 3A. FIG. 4A shows the gap between the microlens 27 in the horizontal direction and the vertical direction in the solid-state imaging device, that is, when the gap is substantially zero. FIG. 4B also shows when the gap between the microlens 27 in the horizontal direction and the vertical direction in the solid-state imaging device is substantially zero.

Figure 4C:
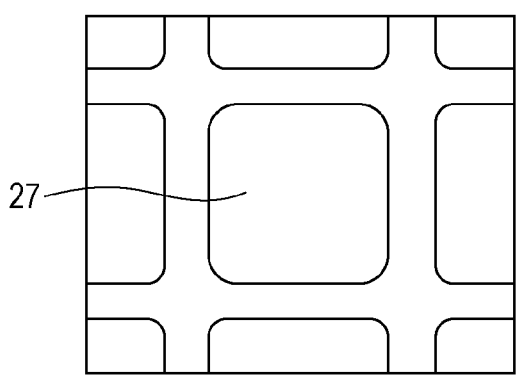

The difference between FIG. 4A and FIG. 4B is the difference in the gap between the microlenses 27 in the diagonal direction. The gap between the microlenses 27 in the diagonal direction is decreased by increasing the etch back amount from the state of FIG. 4A, as shown in FIG. 4B. When the etch back amount is decreased more than FIG. 4A, as shown in FIG. 4C, gaps are generated in the horizontal, vertical, and diagonal directions. When the etch back amount is small, plasma damage due to etching is reduced and the productivity of an etching apparatus increases, but the effective area in the 2-dimensional direction of the microlens 27 reduces, such that the sensitivity characteristic decreases. In the embodiment, since the antireflection coating 33 is formed without a gap at least in the horizontal and vertical directions even if some gaps exist between the microlenses 27 in the diagonal direction, the effective area of the microlens 27 is enlarged and the sensitivity characteristic is improved. FIGS. 4A to 4C show the flat surface state of the microlens 27 according to the etch back amount in the process of FIG. 3A and the antireflection coating 33 is formed in the process after FIG. 3B, for the cases of FIGS. 4A to 4C.

2. Second Embodiment

[Configuration Example of Solid-State Imaging Device]

Figure 5:
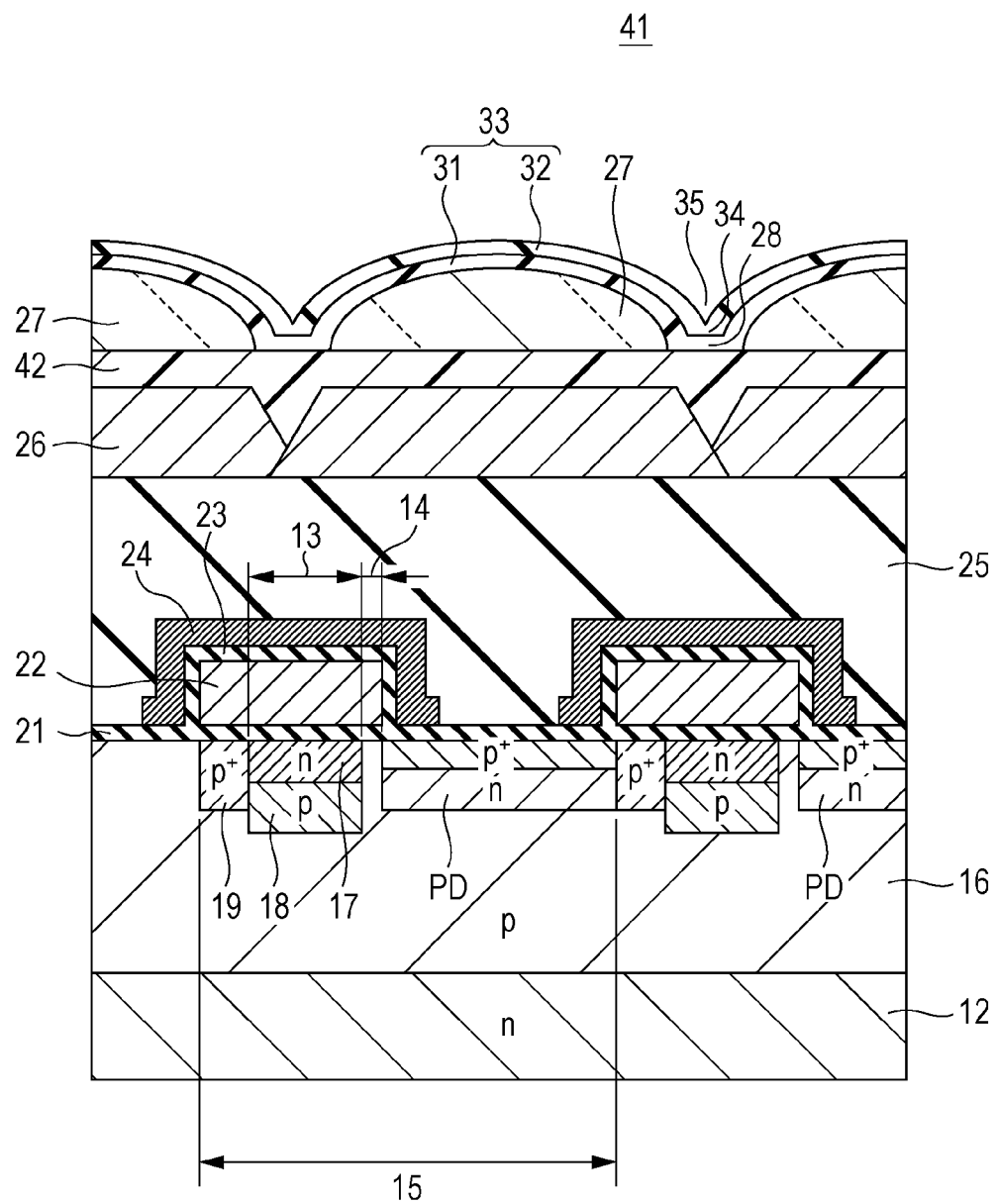
FIG. 5 is a schematic configuration view of the main parts which shows a second embodiment of a solid-state imaging device according to the present disclosure.

FIG. 5 shows a second embodiment of a solid-state imaging device according to the present disclosure. The embodiment exemplifies a CCD solid-state imaging device. FIG. 4, similar to the above description, shows a schematic cross-sectional structure of the main parts including a photoelectric conversion unit (photodiode) that is a light receiving section and a vertical transmission resistor. The solid-state imaging device 41 according to the second embodiment has a configuration in which a microlens 27 is formed by a melt flow process on the color filter 26 of the imaging area described in the first embodiment and an antireflection coating 33 having a two-layered film is formed on the surface of the microlens 27. That is, in the solid-state imaging device 41, a color filter cover film 42 is formed of a thermoplastic resin film, for example, acryl-based thermoplastic resin film on the surface of the color filter 26 and the microlens 27 is formed on the color filter cover film 42 by a metal flow process. The color filter cover film 42 is formed flat. For example, phenol-based thermoplastic resin, other than the acryl-based thermoplastic resin, may be used as the material of the color filter cover film 42.

The color filter cover film 42 is an insulating film for planarizing the concave-convexo surface of the color filter 26 and is formed thin with a flat surface. The microlens 27 is formed to correspond to each pixel and a gap is defined between adjacent microlenses 27. Accordingly, with the microlenses 27 formed, a portion of the base color filter cover film 42 is exposed between horizontally and vertically adjacent microlenses 27 in the imaging area.

A first inorganic film 31 is formed on the entire surface including the surface of the microlens 27 and a second inorganic film 32 is formed on the entire surface of the first inorganic film 31. The first inorganic film 31 is also naturally formed on the surface of the exposed color filter cover film 42. At least the second inorganic films 32 are formed to have a V-shaped recess 35 which is formed between the adjacent second inorganic films 32, with the ends of the adjacent second inorganic films 32 of the microlens 27 in contact with each other. An antireflection coating 33 having a two-layered film structure formed by stacking a first inorganic film 31 and a second inorganic film 32 is formed on the surface of the microlens 27.

Similar to that described in the first embodiment, the first inorganic film 31 of the antireflection coating 33 is made of material having a higher refraction index than the microlens 27 and the second inorganic film 32 is made of a material having a lower refraction index than the microlens 27 and the first inorganic film 31. The relationship of refraction index is as follows.

First inorganic film 31>microlens 27>second inorganic film 32.

The microlens 27 is made of an organic film. For example, positive photosensitive acryl-based resin (refraction index of about 1.50), positive photosensitive styrene-based resin (refraction index of about 1.61), and copolymer-based resin of the resin (refraction index of about 1.51 to 1.60) may be used for the organic film. The first inorganic film 31 may be formed of, for example, a silicon nitride (SiN) film (refraction index of about 1.81 to 1.90) or a silicon oxide (SiON) film (refraction index of about 1.52 to 1.80). The second inorganic film 32 may be formed of, for example, a silicon oxide (SiO) film (refraction index of about 1.47) or a silicon oxycarbide (SiOC) film (refraction index of about 1.40).

The first organic film 31 and the second organic film 32 are bonded along the curved surface of the microlens 27, without a non-lens area at least at the interface of the adjacent second inorganic films 32.

As the antireflection coating 33 that prevents light from reflecting from the surface of the microlens 27, a configuration in which a silicon nitride film having high refraction index may be used for the first inorganic film 31 while a silicon oxycarbide film or a silicon oxide film having a low refraction index may be used for the second inorganic film 32 may be possible.

As described above, in view of the antireflection effect, the silicon oxycarbide (SiOC) film having a refraction index lower than the silicon oxide (SiO) film is preferable. As the second inorganic film 32, a silicon oxide (SiO) film may be used to simplify the process, although the antireflection effect is a little smaller than when the silicon oxycarbide (SiOC) film is used for the second inorganic film 32. Simplifying the process is the same as that described above. When the silicon oxycarbide (SiOC) film is used for the second inorganic film 32, the surface after a film is formed has hydrophobic property because $CH_3$ groups exist on the surface when $SiH(CH_3)$ is used for a film forming gas, such that particles stick in a singulation process. In this case, when a SiOC film is used for the second inorganic film 32, it is necessary to makes the surface hydrophilic by applying a plasma process (light ashing) on the surface by using an oxygen gas or the like before cutting a wafer. On the other hand, since the silicon oxide (SiO) film has hydrophilicity, a plasma process for making the film hydrophilic is not necessary, thereby simplifying the process. The second inorganic film is freely selected in view of the antireflection effect or the simplification of the process.

Further, when a silicon nitride film is used at least for the first inorganic film 31, the antireflection effect due to interference of reflecting light from each surface is excellent. Meanwhile, the film thickness of the first organic film 31 is controlled to prevent "corrugation" from being generated, when the color filter cover film 42 is formed of an acryl-based thermoplastic resin and the first inorganic film 31 is formed of a silicon nitride film. As described above, the film thickness of the silicon nitride film that is the first inorganic film 31 is set to 450 nm or less, preferably 400 nm or less. Further, as described above, since corrugation is not generated when the first inorganic film 31 is formed of a silicon oxynitride (SiON) film, it is not necessary to make the film thickness as small as the silicon nitride (SiN) film.

The configurations, except for the color filter 26 and the microlens 27, that is, the configurations of the photodiodes PDs, the vertical transfer resistor 13, the charge reading-output portion 14, and the horizontal transfer resistor and the output portion are the same as those described in the first embodiment. Therefore, the portions corresponding to those of FIG. 1 are given the same reference numerals and repetitive description thereof is not provided in FIG. 5.

According to the solid-state imaging device 41 of the second embodiment, the antireflection coating 33 composed of the first inorganic film 31 having a higher refraction index than the microlens 27 and the second inorganic film 32 having a lower refraction index than the microlens 27 and the first inorganic film 31 are formed on the surface of the microlens 27. The antireflection coating 33 uses an interference action between the light reflecting from the surface of the microlens 27, the light reflecting from the surface of the first inorganic film 31, and the light reflecting from the surface of the second inorganic film 32, and as a result, it is possible to reduce the light reflecting from the surface of the microlens as much as possible and may substantially remove the reflecting light. Therefore, since it is possible to further reduce the ghost generated by surface reflection of the microlens 27, particularly, the actualized ghost of red light when applying the solid-state imaging device 41 to, for example, a camera set, it is possible to further improve the quality of an image.

A portion of the microlens 27 is formed with the microlens 27 by the first and second inorganic films 31 and 32 in the antireflection coating 33 composed of the first and second inorganic films 31 and 32. Since the antireflection coatings 33 (at least the second inorganic films 31) of the adjacent microlenses 33 are in contact with each other and a non-lens area does not exist between the antireflection coating 33, the substantially effective area of the microlens is enlarged and the sensitivity characteristic of the solid-state imaging device 41 can be improved. In the embodiment since it is possible to both reduce the cost and improve the sensitivity characteristic using the antireflection coating 33 having a two-layered film structure, it is possible to simplify the configuration.

The color filter cover film 42 may be formed of a thermoplastic resin film having excellent heat fluidity, for example, an acryl-based thermoplastic resin film. When the color filter cover film 42 is formed of a thermoplastic resin film, for example, made of acryl-based thermoplastic resin and the first inorganic film 31 of the antireflection coating 33 is formed of a silicon nitride (SiN) film, the film thickness of the first inorganic film 31 is set to 450 nm or less. Therefore, it is possible to prevent corrugation from being generated on the color filter cover film 42 and the first inorganic film 31 while achieving an excellent antireflection effect, such that it is possible to provide a high-quality solid-state imaging device. Further, when the first inorganic film 31 is formed of a silicon oxynitride (SiON) film, it is possible to prevent generation of corrugation on the color filter cover film 42 and the first inorganic film 31 regardless of the film thickness of the first inorganic film 31, although the antireflection effect is slightly decreased. Therefore, it is also possible to provide a solid-state imaging device having a good quality without generating corrugation, as far as possible without detracting from the antireflection effect.

[Example of Method of Manufacturing Solid-State Imaging Device]

A method of manufacturing the solid-state imaging device 41 according to the second embodiment is shown in FIGS. 6 and 7. The structure formed under the color filter 26 is not shown in the figures.

First, though not shown, the photodiodes PD, the vertical transfer resistor 13, and the horizontal resistor are formed on the silicon semiconductor substrate 12, the imaging area where a plurality of pixels are 2-dimensionally arranges is formed by forming the light shield film 24, and the output portion is formed.

Figure 6A:
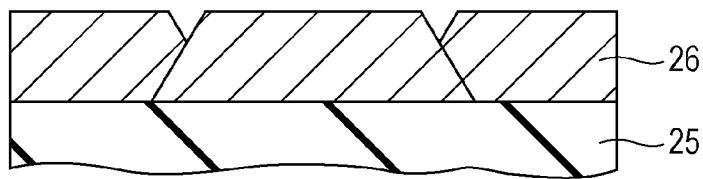
FIGS. 6A to 6D are manufacturing process diagrams (2) showing a method of manufacturing the solid-state imaging device according to the second embodiment.

Next, as shown in FIG. 6A, the insulating film 25 is formed on the entire surface and the color filter 26 is formed on the insulating film 25 by planarizing the surface of the insulating film 25. The color filter 26 may be a primary color-based filter of green red, and blue, or a complementary color-based filter of yellow, cyan, and magenta.

Figure 6B:
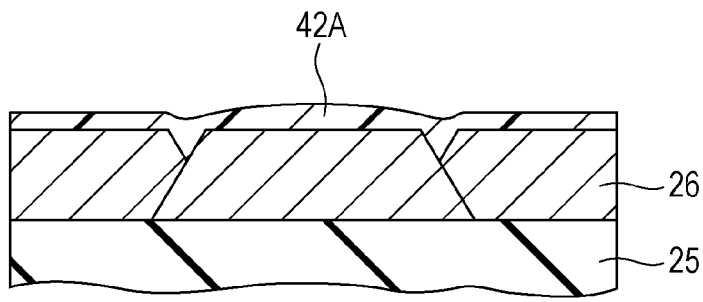

As shown in FIG. 6B, a thermoplastic resin film, for example, acryl-based thermoplastic resin 42A is applied onto the color filter 26 by spin coating. It is necessary to make the acryl-based thermoplastic resin film 42A as thin as possible and planarize the surface. FIG. 5B shows the state after spin coating, as shown in FIG. 5B, the surface of the acryl-based thermoplastic resin film 42A is corrugated by steps (concave and convex) on the surface of the color filter 26.

Figure 6C:
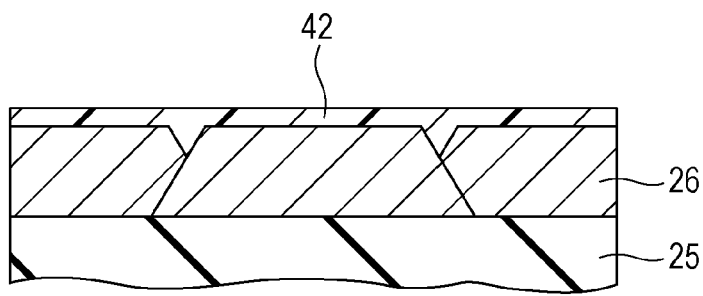
Figure 6D:
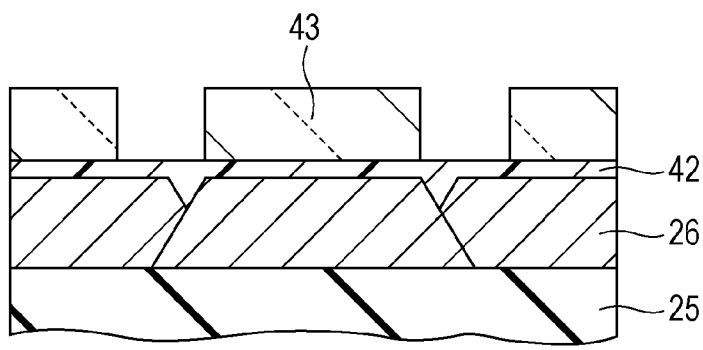

Next, as shown in FIG. 6C, acryl-based thermoplastic resin film 42A is heated on a hot plate. The acryl-based thermoplastic resin film 42A is decreased in thickness after the heat treatment and the surface is planarized by the fluidity. Therefore, the color filter cover film 42 is formed of an acryl-based thermoplastic resin film on the color filter 26.

Next, a photosensitive resin film is formed of, for example, positive photosensitive acryl-based resin, positive photosensitive styrene-based resin, or copolymer-based resin of the resin, which has heat fluidity and a thermoset property, on the color filter cover film 42. An organic film, that is, a resistor film 43 is formed at a position corresponding to each pixel, as shown in FIG. 5D, by using lithography for the photosensitive resin film and performing patterning for each pixel. After the resistor film 43 is formed, ultraviolet rays are radiated to reduce absorption of light by the photosensitizing agent remaining in the resistor film 43. Accordingly, the photosensitizing agent is dissolved and the light transmittance of the resistor film 43 is improved.

Figure 7A:
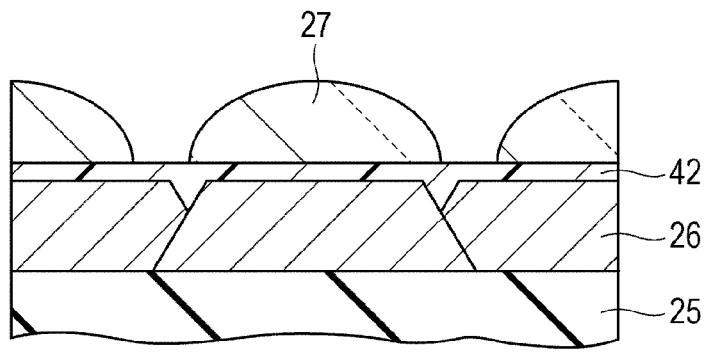
FIGS. 7A to 7C are manufacturing process diagrams (2) showing a method of manufacturing the solid-state imaging device according to the second embodiment.

Next, as shown in FIG. 7A, the microlens 27 having a convex curved surface at the upper portion is formed by heating the formed resistor film 43 at a temperature higher than the thermal softening temperature, that is, by performing a reflow treatment. The resistor film 43 includes a thermoset group in the molecules of the resin or is added with a thermal curing agent, such that it is hardened after generating heat flow in the heat treatment process.

The microlenses 27 are formed to have a gap between adjacent microlenses. Therefore, a portion of the color filter cover film 42 is exposed between adjacent microlenses 27.

Figure 7B:
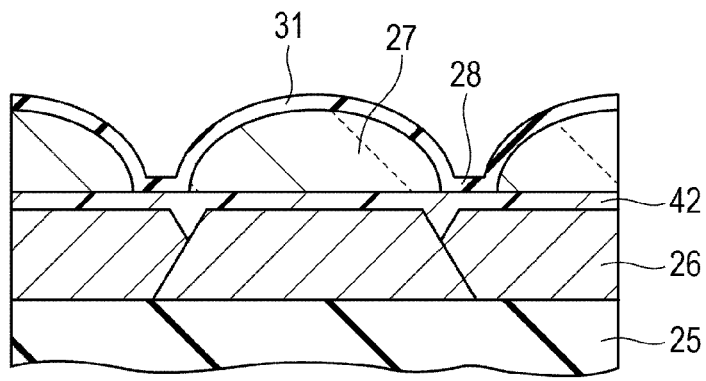

Next, as shown in FIG. 7B, the first inorganic film 31 is formed on the entire surface including the surface of the microlens 27 and the surface of the exposed color filter cover film 42. The first inorganic film 31 is formed of, for example, a silicon nitride (SiN) film or a silicon oxynitride (SiON) film, which is formed by plasma CVD. In this case, it is preferable that the formation temperature is 250° C. or less in consideration of heat resistance of the color filter 26 and the microlens 27 that are formed of various organic films. In this configuration, the when acryl-based thermoplastic resin is selected for the microlens material, a silicon nitride (SiN) film having a film thickness of 450 nm or less is used as the first inorganic film 31.

A silicon oxynitride (SiON) film may be used as the first inorganic film 31. In this case, although the antireflection effect slightly decreases, corrugation is not generated.

Figure 7C:
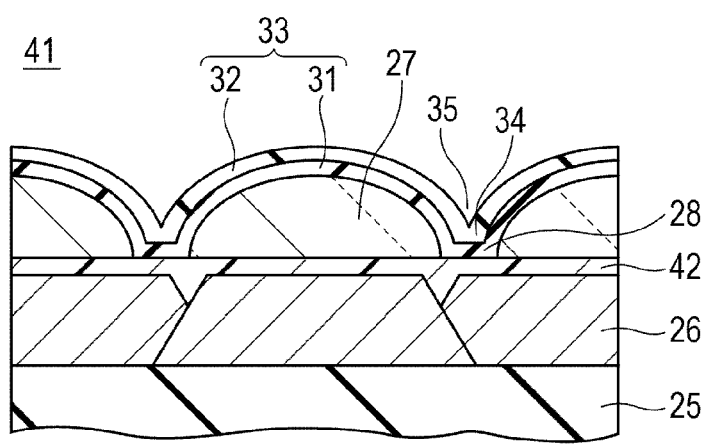

Next, as shown in FIG. 7C, the second inorganic film 32 is formed on the entire surface of the first inorganic film 31. The second inorganic film 32 may be formed of, for example, a silicon oxide (SiO) film or a silicon oxycarbide (SiOC) film by using plasma CVD (Chemical Vapor Deposition). In this case, it is preferable that the formation temperature of the second inorganic film 32 is 250° C. or less, in view of the thermal resistance of the color filter 26 and the microlens 27 formed of various organic films. The second inorganic films 32 on the adjacent microlenses 27 are formed to have a V-shaped recess 35 between the second inorganic films 32, with the ends in contact with each other, without a non-lens area at the interface between the first inorganic films 32.

As a result, the desired solid-state imaging device 41 having the antireflection film 33 according to the two-layered film composed of the first inorganic film 31 and the second inorganic film 32 on the surface of the microlens 27 is achieved.

According to the method of manufacturing the solid-state imaging device 41 of the embodiment the microlens 27 is formed by the melt flow process and the antireflection coating 33 having a two-layered film structure having the refraction index relationship is formed on the surface of the microlens 27. At least the second inorganic films 32 of the antireflection coating 33 are formed without a gap therebetween. Therefore, generation of a ghost due to surface reflection of the microlens 27 is reduced, the effective area of the microlens 27 is enlarged, and it is possible to manufacture a solid-state imaging device that increases the quality of an image and improves the sensitivity characteristic.

3. Third Embodiment

[Configuration Example of Solid-State Imaging Device]

Figure 8:
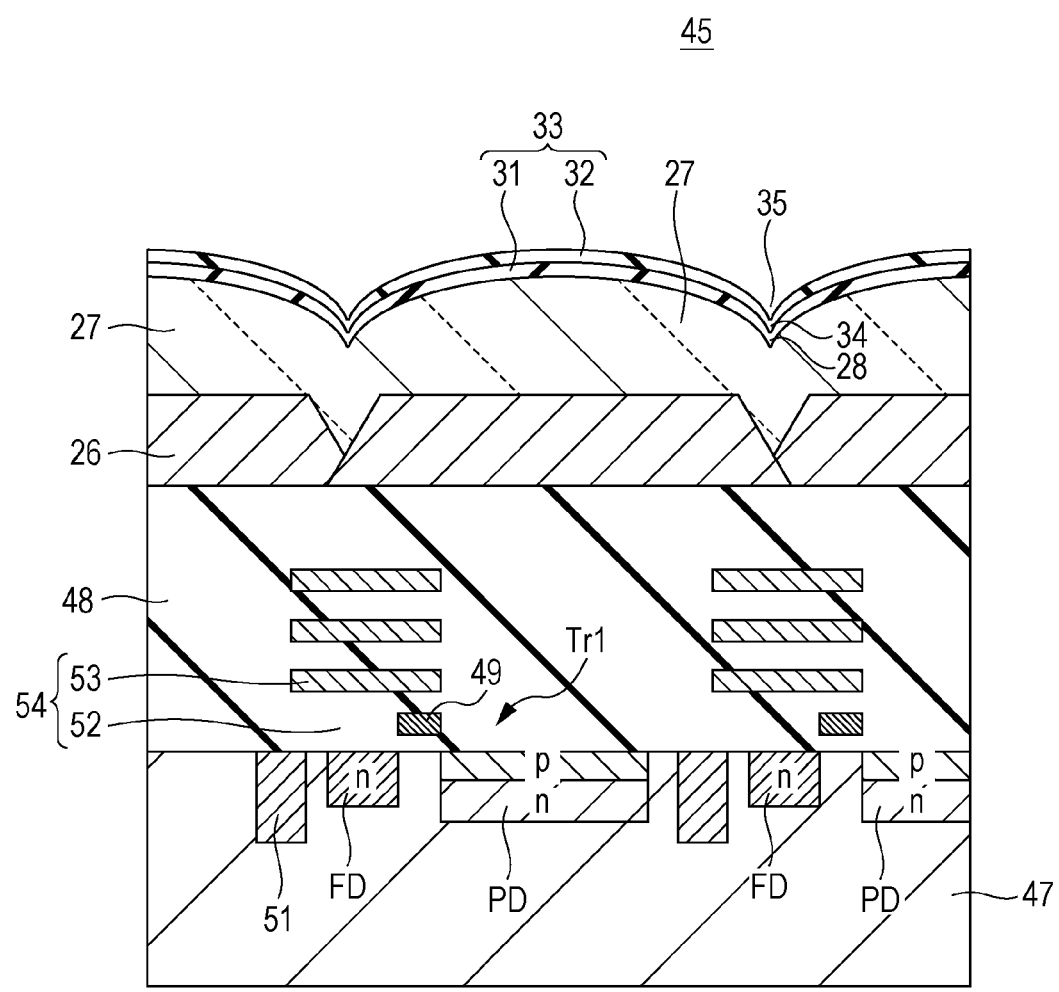
FIG. 8 is a schematic configuration view of the main parts which shows a third embodiment of a solid-state imaging device according to the present disclosure.

FIG. 8 shows a third embodiment of a solid-state imaging device according to the present disclosure. The embodiment exemplifies a surface radiation type CMOS solid-stage imaging apparatus. A solid-state imaging device 45 according to the third embodiment has a configuration including photodiodes PDs that are photoelectric conversion units and an imaging area where a plurality of pixels composed of a plurality of pixel transistors is 2-dimensionally regularly arranged, on a silicon semiconductor substrate 47. The pixel transistor is a unit that reads out signal charges of the photodiode PD. The photodiode PD, though not shown, is formed to have a first conductive type, in the embodiment, an n-type charge accumulation area that performs both photoelectric conversion and charge accumulation and a second conductive type, in the embodiment, a p-type semiconductor area that also suppresses dark current on the surface.

The photodiode PD and the pixel transistor, though not shown, are formed in a p-type well area formed at the surface side of the semiconductor substrate 47. FIG. 8 shows a transfer transistor Tr1 as a representative of a plurality of pixel transistors of pixels. The transfer transistor Tr1 is formed to have a transfer gate electrode 49 formed through a gate insulating film 48, with a floating diffusion FD as a drain by the n-type semiconductor area, with the photodiode PD as a source.

The plurality of pixel transistors of the pixel may be composed of four transistors, that is, a transmission transistor, an amplification transistor, a reset transistor, and a selection transistor, or three transistors without the selection transistor. As the pixel, one photoelectric conversion unit and a unit pixel composed of a plurality of pixels transistors may be used. Further, as the pixel, a so-called pixel-sharing structure in which a plurality of photoelectric conversion units shares pixel transistor, except for the transfer transistor may be used.

Element separation areas 51 that separate the unit pixels are formed in the semiconductor substrate 47. A multilayered-wire layer 54 where a plurality of layers of wires 53 is disposed through the interlayer insulating film 52 is formed in the semiconductor substrate 47. The wire 53 is composed of a barrier metal layer formed by a damascene process and a conductive layer made of copper. The interlayer insulating film 52 is, for example, formed of a silicon oxide film. Microlenses 27 corresponding to the color filters 26 and the pixels are stacked on the multilayered-wire layer 54.

For the color filter 26, as described above, for example, primary color-based color filters of green, red, and blue, or complementary color-based color filters, of yellow, cyan, magenta may be used. For example, a check-arranged primary color-based color filter may be used as the color filter 26.

Further, in the embodiment, the microlenses 27 are formed by an etch back process, without a non-lens area at the interface of vertically and horizontally adjacent microlenses 27, the same way as in the first embodiment. That is, in the microlenses 27, the ends of adjacent microlenses 27 are in contact with each other, such that a V-shaped recess 28 is formed between the adjacent microlenses 27. An antireflection coating 33 having a two-layered film structure formed by stacking a first inorganic film 31 and a second inorganic film 32 is formed on the surface of the microlens 27.

As described above, the first inorganic film 31 of the antireflection coating 33 is made of material having a higher refraction index than the microlens 27 and the second inorganic film 32 is made of a material having a lower refraction index than the microlens 27 and the first inorganic film 31. The microlens 27 may be formed of an organic film, such as an organic film, for example, made of acryl-based thermoset resin, acryl-based thermoplastic resin, styrene-based thermoset resin, styrene-based photocrosslinkable resin, or copolymer-based resin of the resin. The first inorganic film 31 may be made of, for example, a silicon nitride (SiN) film or a silicon oxynitride (SiON) film. The second inorganic film 32 may be made of, for example, a silicon oxide (SiO) film or a silicon oxycarbide (SiOC) film.

The first organic film 31 and the second organic film 32 are bonded along the curved surface of the microlens 27, without a non-lens area at the interface of the adjacent inorganic films.

In addition, the configurations of the microlens 27, the first inorganic film 31 and the second inorganic film 32 of the antireflection coating 33 are the same as those described in the first embodiment and the repetitive description is not provided.

[Example of Method of Manufacturing Solid-State Imaging Device]

Even the color filter 26 can be formed in a common manufacturing process, as a method of manufacturing the solid-state imaging device 45 according to the third embodiment. That is, a process of forming a plurality of pixels composed of the photodiode PD and a plurality of pixel transistors and the element separation areas 51 on the semiconductor substrate 47 and a process of forming the multilayered-wire layer 54 where a plurality of layers of wires 53 is disposed through the interlayer insulating layer 52 above the surface of the semiconductor substrate 47. The multilayered-wire layer 54 may be formed by disposing the wire 53 composed of the barrier metal layer and the conductive layer made of copper to be embedded in the interlayer insulating layer 52, for example, formed of a silicon oxide film, using a damascene process. Further, the color filter 26 is formed on the multilayered-wire layer 54 in the imaging area.

Next, the antireflection coating 33 is formed by sequentially forming the microlens 27 and the first inorganic film 31 and the second inorganic film 32 on the surface of the microlens in the same processes shown in FIGS. 2A to 3C, thereby achieving the desired solid-state imaging device 45.

According to the solid-state imaging device 45 of the third embodiment, the antireflection coating 33 composed of the first inorganic film 31 having a higher refraction index than the microlens 27 and the second inorganic film 32 having a lower refraction index than the microlens 27 and the first inorganic film 31 are formed on the surface of the microlens 27. Further, a portion of microlens 27 is formed with the microlens 27 by the first and second inorganic films 31 and 32 in the antireflection coating 33 composed of the first and second inorganic films 31 and 32. Since the antireflection coatings 33 of the adjacent microlenses are in contact with each other and a non-lens area does not exist between the antireflection coating 33, the substantially effective area of the microlens is enlarged.

By this configuration, as described in the first embodiment, it is possible to reduce the light reflecting from the surface of the microlens 27 as less as possible and may substantially remove the reflecting light. Therefore, since it is possible to more reduce the ghost generated by surface reflection of the microlens 27, particularly, the actualized ghost of red light when applying the solid-state imaging device 45 to, for example, a camera set, it is possible to more improve the quality of an image. Further, it is possible to improve the sensitivity characteristic of the solid-state imaging device 45. In the embodiment since it is possible to both reduce cost and improve the sensitivity characteristic by the antireflection coating 33 having a two-layered film structure, it is possible to simplify the configuration.

Further, when the microlens 27 is formed of a thermoplastic resin film, for example, made of acryl-based thermoplastic resin and the first inorganic film 31 of the antireflection coating 33 is formed of a silicon nitride (SiN) film, the film thickness of the first inorganic film 31 is set to 450 nm or less. Therefore, it is possible to prevent corrugation from being generated on the first inorganic film 31 while achieving an excellent antireflection effect, such that it is possible to provide a high-quality solid-state imaging device. Further, the microlens 27 may be formed of a thermoplastic resin film, for example, an acryl-based thermoplastic resin film and the first inorganic film 31 may be formed of a silicon oxynitride (SiON) film. In this configuration, it is possible to prevent the generation of corrugation not by the film thickness of the first inorganic film 31 although the antireflection effect is slightly decreased. Therefore, it is also possible to provide a solid-state imaging device having a good quality without generating corrugation, maximally without detracting from the antireflection effect.

4. Fourth Embodiment

[Configuration Example of Solid-State Imaging Device]

Figure 9:
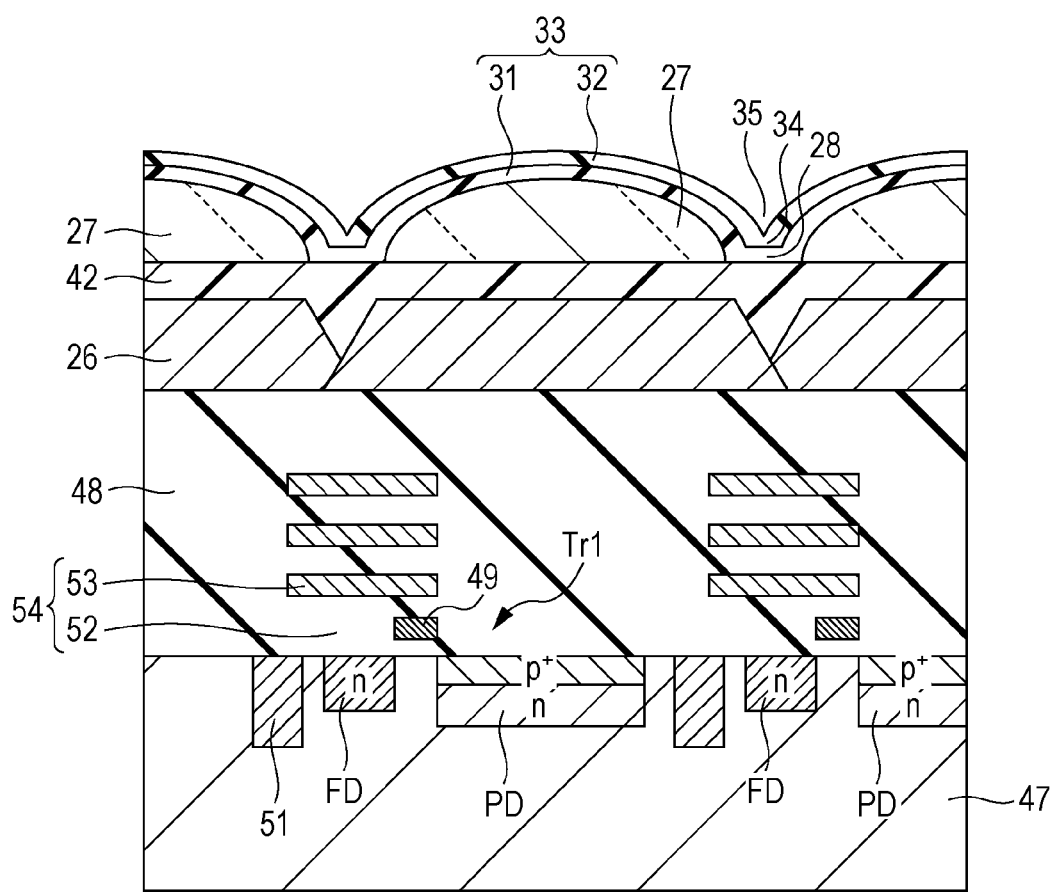
FIG. 9 is a schematic configuration view of the main parts which shows a fourth embodiment of a solid-state imaging device according to the present disclosure.

FIG. 9 shows a fourth embodiment of a solid-state imaging device according to the present disclosure. The embodiment exemplifies a surface radiation type CMOS solid-state imaging device. As in the above-described FIG. 8, FIG. 9 shows a schematic cross-sectional structure of the main parts including a pixel composed of a photodiode that is a photoelectric conversion unit and a plurality of pixel transistors. The solid-state imaging device 46 according to the fourth embodiment has a configuration in which a microlens 27 is formed by a melt flow process on the color filter 26 of the imaging area described in the third embodiment and an antireflection coating 33 having two-layered film is formed on the surface of the microlens 27. That is, in the solid-state imaging device 46, a color filter cover film 42 is formed of a thermoplastic resin film, for example, acryl-based thermoplastic resin film on the surface of the color filter 26 and the microlens 27 is formed on the color filter cover film 42 by a metal flow process.

As described in the second embodiment, the color filter cover film 42 is an insulating film for planarizing the concave-convexo surface of the color filter 26 and is formed thin with a flat surface. The microlens 27 is formed to correspond to each pixel and a gap is defined between adjacent microlenses 27. Accordingly, with the microlenses 27 are formed, a portion of the base color filter cover film 42 is exposed between horizontally and vertically adjacent microlenses 27 in the imaging area.

A first inorganic film 31 is formed on the entire surfaced including the surface of the microlens 27 and a second inorganic film 32 is formed on the entire surface of the first inorganic film 31. The first inorganic film 31 is also obviously formed on the surface of the exposed color filter cover film 42. At least the second inorganic films 32 are formed to have a V-shaped recess 35 is formed between the adjacent second inorganic films 32, with the ends of the adjacent second inorganic films 32 of the microlens 27 in contact with each other. An antireflection coating 33 having a two-layered film structure formed by stacking a first inorganic film 31 and a second inorganic film 32 is formed on the surface of the microlens 27.

As described above, the first inorganic film 31 of the antireflection coating 33 is made of material having a higher refraction index than the microlens 27 and the second inorganic film 32 is made of a material having a lower refraction index than the microlens 27 and the first inorganic film 31. The microlens 27 may be formed of an organic film, such as an organic film, for example, made of positive photosensitive acryl-based resin, positive photosensitive styrene-based resin, or copolymer-based resin of the resin. The first inorganic film 31 may be made of, for example, a silicon nitride (SiN) film or a silicon oxynitride (SiON) film. The second inorganic film 32 may be made of, for example, a silicon oxide (SiO) film or a silicon oxycarbide (SiOC) film.

The first organic film 31 and the second organic film 32 are bonded along the curved surface of the microlens 27, without a non-lens area at least at the interface of the adjacent second inorganic films 32. In addition, the configurations of the color filter cover film 42, the microlens 27, the first and second inorganic films 31 and 32 of the antireflection coating 33 are the same as those described in the second embodiment and the repetitive description is not provided.

The other configurations under the color filter cover film 42, that is, the configurations of the multilayered-wire layer 54, the photodiode PD, the pixel transistor and the like are the same as those in the third embodiment, such that the components corresponding to those of FIG. 8 are given the same reference numerals in FIG. 9 and the repetitive description is not provided.

[Example of Method of Manufacturing Solid-State Imaging Device]

Even the color filter 26 can be formed in a manufacturing process of a common surface radiation type solid-state imaging device, as a method of manufacturing a solid-state imaging device 46 according to the fourth embodiment. That is, a process of forming a plurality of pixels composed of the photodiode PD and a plurality of pixel transistors and the element separation areas 51 on the semiconductor substrate 47 and a process of forming the multilayered-wire layer 54 where a plurality of layers of wires 53 is disposed through the interlayer insulating layer 52 above the surface of the semiconductor substrate 47. The multilayered-wire layer 54 may be formed by disposing the wire 53 composed of the barrier metal layer and the conductive layer made of copper to be embedded in the interlayer insulating layer 52, for example, formed of a silicon oxide film, using a damascene process. Further, the color filter 26 is formed on the multilayered-wire layer 54 in the imaging area.

Next, the antireflection coating 33 is formed by sequentially forming the color filter cover film 42, the microlens 27 and the first inorganic film 31 and the second inorganic film 32 on the surface of the microlens 27 in the same processes shown in FIGS. 6A to 7C, thereby achieving the desired solid-state imaging device 46.

According to the solid-state imaging device 46 of the fourth embodiment, the antireflection coating 33 composed of the first inorganic film 31 having a higher refraction index than the microlens 27 and the second inorganic film 32 having a lower refraction index than the microlens 27 and the first inorganic film 31 are formed on the surface of the microlens 27. Further, a portion of microlens 27 is formed with the microlens 27 by the first and second inorganic films 31 and 32 in the antireflection coating 33 composed of the first and second inorganic films 31 and 32. Since the antireflection coatings 33, at least the second inorganic films 32 of the adjacent microlenses are in contact with each other and a non-lens area does not exist between the antireflection coatings 33, the substantially effective area of the microlens is enlarged.

By this configuration, as described in the second embodiment, it is possible to reduce the light reflecting from the surface of the microlens 27 as less as possible and may substantially remove the reflecting light. Therefore, since it is possible to more reduce the ghost generated by surface reflection of the microlens 27, particularly, the actualized ghost of red light when applying the solid-state imaging device 46 to, for example, a camera set, it is possible to more improve the quality of an image. Further, it is possible to improve the sensitivity characteristic of the solid-state imaging device 46. In the embodiment since it is possible to both reduce cost and improve the sensitivity characteristic by the antireflection coating 33 having a two-layered film structure, it is possible to simplify the configuration.

Further, when the color filter cover film 42 is formed of a thermoplastic resin film, for example, made of acryl-based thermoplastic resin and the first inorganic film 31 of the antireflection coating 33 is formed of a silicon nitride (SiN) film, the film thickness of the first inorganic film 31 is set to 450 nm or less. Therefore, it is possible to prevent corrugation from being generated on the color filter cover film 42 and the first inorganic film 31 while achieving an excellent antireflection effect, such that it is possible to provide a high-quality solid-state imaging device. Further, the color filter cover film 42 may be formed of a thermoplastic resin film, for example, an acryl-based thermoplastic resin film and the first inorganic film 31 may be formed of a silicon oxynitride (SiON) film. In this configuration, it is possible to prevent the generation of corrugation not by the film thicknesses of the color filter cover film 42 and the first inorganic film 31 although the antireflection effect is slightly decreased. Therefore, it is also possible to provide a solid-state imaging device having a good quality without generating corrugation, maximally without detracting from the antireflection effect.

5. Fifth Embodiment

[Configuration Example of Solid-State Imaging Device]

Figure 10:
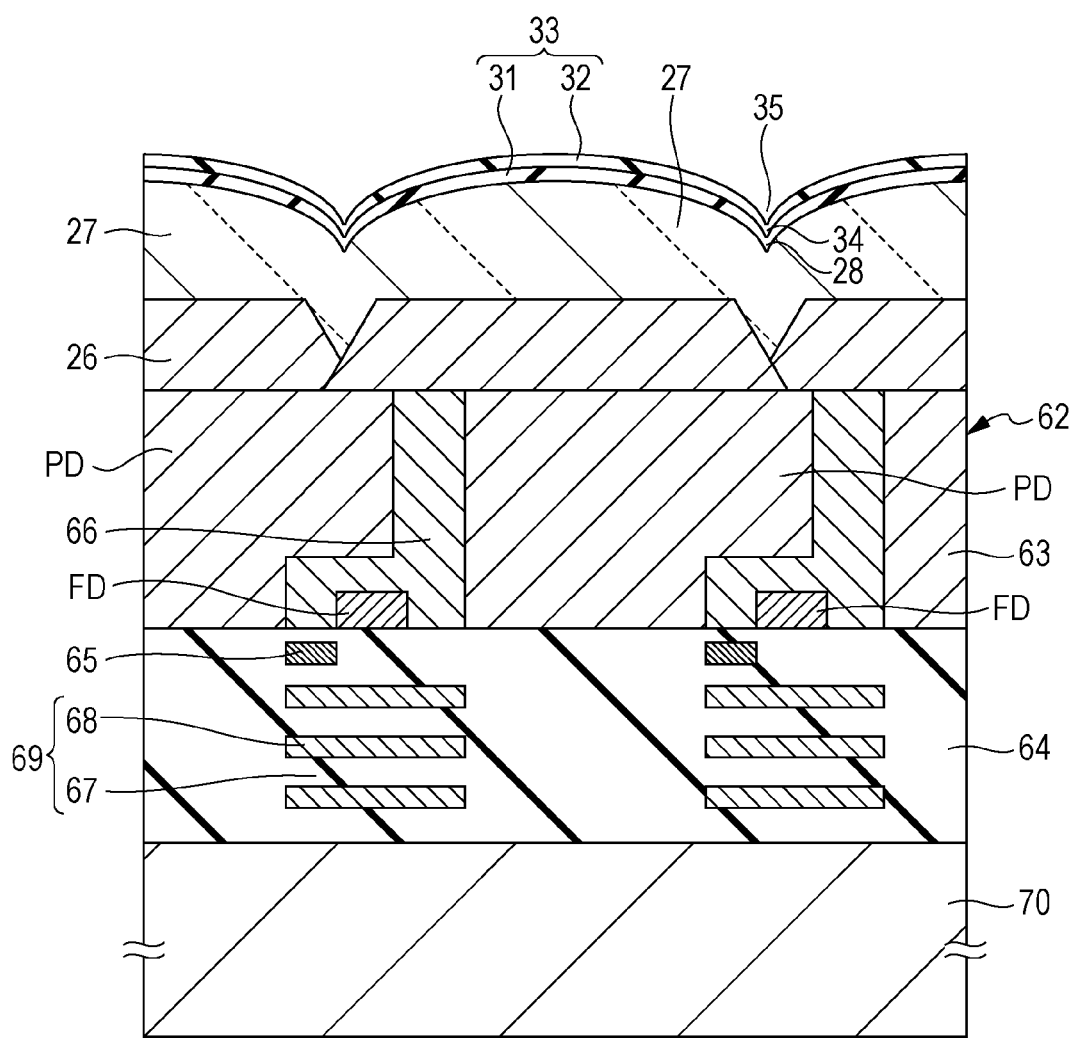
FIG. 10 is a schematic configuration view of the main parts which shows a fifth embodiment of a solid-state imaging device according to the present disclosure.

FIG. 10 shows a fifth embodiment of a solid-state imaging device according to the present disclosure. The embodiment exemplifies a rear surface radiation type CMOS solid-state imaging device. A solid-state imaging device 57 according to the fifth embodiment has a configuration including photodiodes PDs that are photoelectric conversion units and a pixel area where a plurality of pixels composed of a plurality of pixel transistors is 2-dimensionally regularly arranged, on a silicon semiconductor substrate 62 with a reduced thickness. The photodiode PD, the entire area in the thickness direction of the semiconductor substrate 62, though not shown, is formed to have a first conductive type, in the embodiment, an n-type charge accumulation area that performs both photoelectric conversion and charge accumulation and a second conductive type, in the embodiment, a p-type semiconductor area that also restrains dark current on the interfaces of both the surface and the rear surface. Photodiodes PDs are formed to extend under the plurality of pixel transistors. The plurality of pixel transistors are formed in the p-type semiconductor well area 63 formed at the surface side of the semiconductor substrate 62. In the figure, a transfer transistor Tr1 is shown as a representative of a plurality of pixel transistors. The transfer transistor Tr1 is formed to have a transfer gate electrode 65 formed through a gate insulating film 64, with a floating diffusion FD as a drain by the n-type semiconductor area, with the photodiode PD as a source. For example, a p-type semiconductor layer that is an element separation area 66 is formed between adjacent pixels.

A multilayered-wire layer 69 where a plurality of layers of wires 68 are disposed through an interlayer insulating film 67 is formed at the surface side of the semiconductor substrate 62 and a support substrate 70 is bonded on the multilayered-wire layer 69. The wires 68 are not limited in disposing and are formed even on the photodiode PD. The rear surface opposite to the multilayered-wire layer 69 of the semiconductor substrate 62 is a light receiving surface and the color filter 26 is formed at the rear surface side of the substrate. The color filter 26 has the same configuration as that described above.

Further, in the embodiment, the microlenses 27 are formed by an etch back process, without a non-lens area at the interface of vertically and horizontally adjacent microlenses 27, the same way as in the first embodiment. That is, in the microlenses 27, the ends of adjacent microlenses 27 are in contact with each other, such that a V-shaped recess 28 is formed between the adjacent microlenses 27. An antireflection coating 33 having a two-layered film structure formed by stacking a first inorganic film 31 and a second inorganic film 32 is formed on the surface of the microlens 27.

As described above, the first inorganic film 31 of the antireflection coating 33 is made of material having a higher refraction index than the microlens 27 and the second inorganic film 32 is made of a material having a lower refraction index than the microlens 27 and the first inorganic film 31. The microlens 27 may be formed of an organic film, such as an organic film, for example, made of acryl-based thermoset resin, acryl-based thermoplastic resin, styrene-based thermoset resin, styrene-based photocrosslinkable resin, or copolymer-based resin of the resin. The first inorganic film 31 may be made of, for example, a silicon nitride (SiN) film or a silicon oxynitride (SiON) film. The second inorganic film 32 may be made of, for example, a silicon oxide (SiO) film or a silicon oxycarbide (SiOC) film.

The first organic film 31 and the second organic film 32 are bonded along the curved surface of the microlens 27, without a non-lens area at the interface of the adjacent inorganic films.

In addition, the configurations of the microlens 27, the first inorganic film 31 and the second inorganic film 32 of the antireflection coating 33 are the same as those described in the first embodiment and the repetitive description is not provided.

Although the rear surface radiation type CMOS solid-state imaging device according to the fifth embodiment has the configuration without a color filter cover film, a configuration with a color filter cover film may be possible.

[Example of Method of Manufacturing Solid-State Imaging Device]

Even the color filter 26 can be formed in a manufacturing process of a common rear surface radiation type solid-state imaging device, as a method of manufacturing a solid-state imaging device 47 according to the fifth embodiment. That is, a plurality of pixels composed of a photodiode PD and a plurality of pixel transistors and an element separation area that separates pixels are formed in an imaging area of the semiconductor substrate 62. A multilayered-wire layer 69 where a plurality of layers of wires 68 is disposed through the interlayer insulating film 67 is formed on the substrate of the semiconductor substrate 70. The multilayered-wire layer 69 is formed by a damascene process, as described above. Next, the support substrate 70, for example, made of a silicon substrate, is bonded on the multilayered-wire layer 69, and then the thickness of the semiconductor layer 62 is reduced, with the photodiodes PDs facing the rear surface of the substrate, by performing CMP (Chemical Mechanical Polishing) on the rear surface of the semiconductor substrate 62. A p-type semiconductor layer that also controls dark current is formed on the rear surface of the substrate after reducing the thickness.

Next, the antireflection coating 33 is formed by sequentially forming the microlens 27 and the first inorganic film 31 and the second inorganic film 32 on the surface of the microlens 27 by the same processes as those shown in FIGS. 2A to 3C, thereby achieving the desired solid-state imaging device 47.

According to the solid-state imaging device 57 according to the fifth embodiment, light travels into the rear surface side where the multilayered-wire 69 of the semiconductor substrate 62 is formed. Further, since the microlens 27 and the antireflection coating 33 have the same configurations as those described in the third embodiment, a non-lens area does not exists between the antireflection coatings 33 of the adjacent microlenses, such that the actual effective area of the microlens is enlarged and the sensitivity characteristic is improved. It is possible to substantially remove light reflecting from the surface of the microlens 27, such that it is possible to further reduce the ghost that is generated by surface reflection of the microlens 27, particularly the actualized ghost of red light when applying the solid-state imaging device 47 to a camera set. Therefore, it is possible to implement higher quality of an image. In the embodiment since it is possible to both reduce cost and improve the sensitivity characteristic by the antireflection coating 33 having a two-layered film structure, it is possible to simplify the configuration.

Further, when the microlens 27 is formed of a thermoplastic resin film, for example, made of acryl-based thermoplastic resin and the first inorganic film 31 of the antireflection coating 33 is formed of a silicon nitride (SiN) film, the film thickness of the first inorganic film 31 is set to 450 nm or less. Therefore, it is possible to prevent corrugation from being generated on the first inorganic film 31 while achieving an excellent antireflection effect, such that it is possible to provide a high-quality solid-state imaging device. Further, the microlens 27 may be formed of a thermoplastic resin film, for example, an acryl-based thermoplastic resin film and the first inorganic film 31 may be formed of a silicon oxynitride (SiON) film. In this configuration, it is possible to prevent the generation of corrugation not by the film thickness of the first inorganic film 31 although the antireflection effect is slightly decreased. Therefore, it is also possible to provide a solid-state imaging device having a good quality without generating corrugation, maximally without detracting from the antireflection effect.

Although the microlens 27 is formed by an etch back process in the fifth embodiment, on the other hand, a rear surface radiation type CMOS solid-state imaging device may be implemented by forming the microlens with the metal flow process described above in the fourth embodiment. In this case, the same effect as that described in the fourth embodiment is accomplished.

The rear surface radiation type solid-state imaging device according to the fifth embodiment is advantageous as a technique that reduces the focal point distance of the microlens 27 because, as shown in FIG. 10, a color filter cover film is not provided and the distance between the photodiode PD and the microlens 27 is small.

Figure 11A:
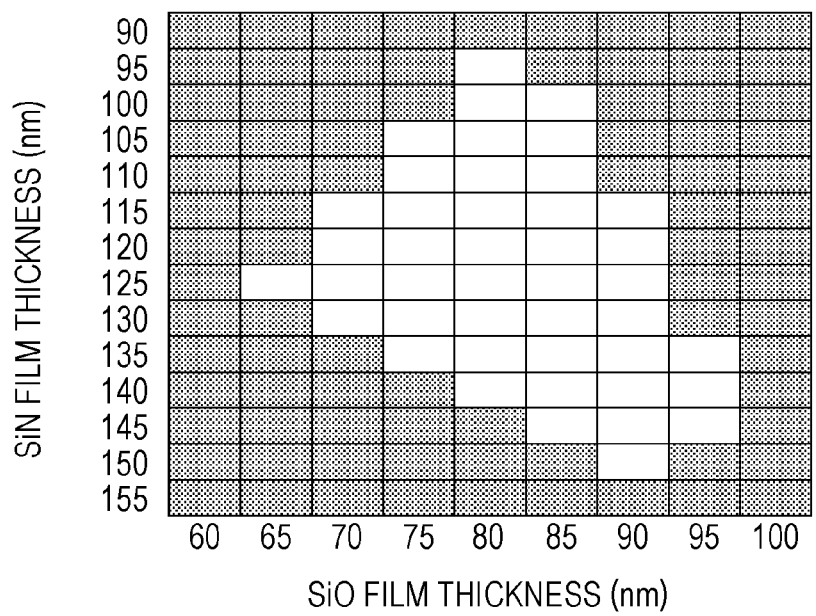
FIGS. 11A and 11B are graphs of the film thickness, and frequency-reflectance of a two-layered film that is very suitable for an antireflection coating according to the present disclosure.
Figure 11B:
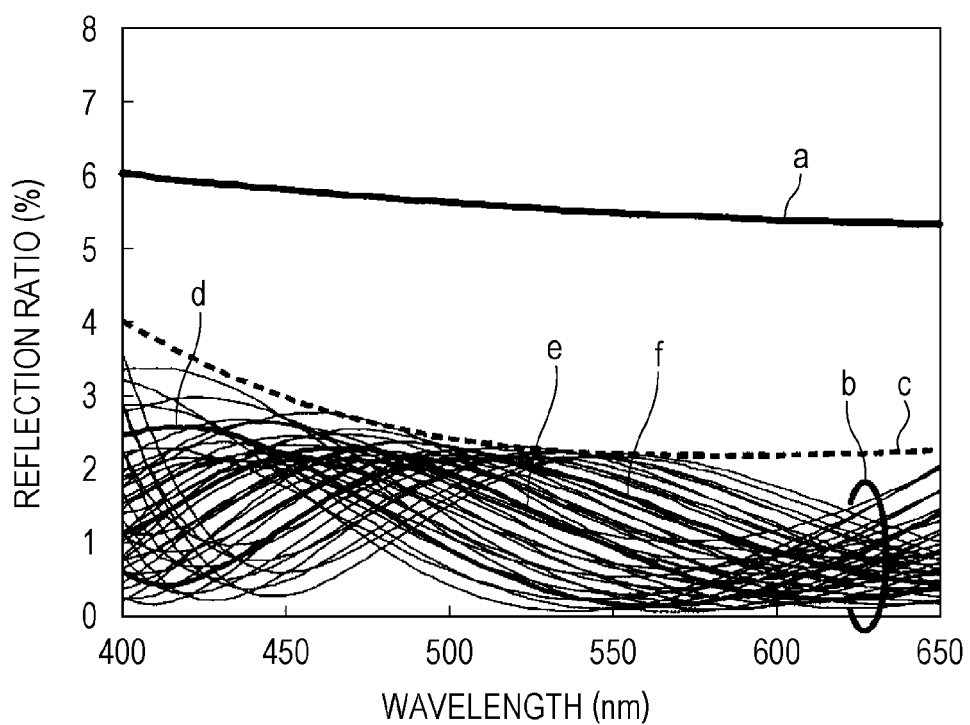

The antireflection effects of the microlenses 27 according to the embodiments described above are described in more detail here. FIG. 11B shows a surface reflection index, comparing surface reflection (curve "a", curve group "b", and curve "c") of samples. The curve "a" is a surface reflection index of a single microlens made of polystyrene-based resin. The curve group "b" is a surface reflection index when the antireflection coating 33 is formed of a two-layered film of the embodiment, on the surface of the single microlens. The curve "c" is a surface reflection index when only a silicon oxide (SiO) film having a thickness of 100 nm is formed as an antireflection coating implemented as a single layer on the surface of the single microlens.

In the antireflection coating 33, a silicon nitride (SiN) film was used as the first inorganic film 31 and a silicon oxide (SiO) film was used as the second inorganic film 32. FIG. 11A shows preferable combinations of film thicknesses when the film thickness of the silicon nitride (SiN) film that is the first inorganic film was changed between 90 nm and 155 nm and the film thickness of the silicon oxide (SiO) film that is the second inorganic film 32 was changed between 60 nm and 100 nm. In the combinations of the film thicknesses of the first inorganic film 31 and the second inorganic film 32, combinations that can reduce the peak of the reflection index lower than reflection when only a single layer of antireflection coating (SiO) having a depth of 100 nm is formed on the surface of the single microlens made of polystyrene-based resin are shown with the white portions in FIG. 11A. The unit of scale is 5 nm. The reason of selecting the silicon oxide (SiO) film as a comparative example is because it is lower in reflection index than the microlens while the type of film is generally used as a semiconductor processor and can be easily formed, in order to reduce the surface reflection of the single microlens. Comparing the curve "a" and the curve group "b" in FIG. 11B, it is seen that the surface reflection is ½ or less when only a silicon oxide (SiO) film having a thickness of 100 nm is formed as an antireflection coating that is a single layer, for the single microlens (FIG. 11Ba).

(1) The embodiments of the present disclosure have higher antireflection effect than when the antireflection coating is a SiO single layer. That is, the effect is small for a single layer of antireflection coating. (2) Although it is preferable that the film thickness for achieving an appropriate antireflection effect is about 100 nm in the SiO single layer of antireflection coating, with this film thickness, the gap between the microlenses is not filled by a melt flow process and the sensitivity characteristic is more deteriorated than the present disclosure. (3) Although a SiOC single layer of antireflection coating has higher antireflection effect than the SiO single layer, the gap between the microlenses is not filled, with the film thickness that allows achieving an appropriate antireflection effect for the same reason as (2).

Ranges of film thicknesses that can be reduced are shown in Table 1.

TABLE 1

[Unit: nm]

| SiN | SiO |
|---|---|
| 95 | 80 |
| 100 | 80 ~ 85 |
| 105 | 75 ~ 85 |
| 110 | 75 ~ 85 |
| 115 | 70 ~ 90 |
| 120 | 70 ~ 90 |
| 125 | 65 ~ 90 |
| 130 | 70 ~ 90 |
| 135 | 75 ~ 90 |
| 140 | 80 ~ 95 |
| 145 | 85 ~ 95 |
| 150 | 90 |

In the curve group "b" of FIG. 11B, a reflection index (%) to the wavelength (nm) of incident light traveling on the antireflection coating 33 according to the combinations of the film thicknesses shown in FIG. 11A and Table 1. The curves of thin lines and heavy lines in the curve group "b" correspond to the combinations of the film thickness.

The curve (heavy line) "a" shows the surface reflection characteristic at wavelengths of 400 nm to 650 nm in the single microlens made of the polystyrene-based resin.

The curve (heavy dotted line) "c" shows the surface reflection characteristic at wavelengths of 400 nm to 650 nm when only SiO were formed with 100 nm as an antireflection coating formed in one layer on the surface of the microlens made of the polystyrene-based resin.

The curve (heavy line) "d" shows the surface antireflection characteristic at wavelengths of 400 nm to 650 nm of a film thickness configuration that shows a good antireflection effect for green light, for a microlens with the antireflection coating 33 formed on the surface of the embodiment. As the film thickness configuration, the film thickness of the silicon nitride (SiN) film that is the first inorganic film 31 is 105 nm and the film thickness of the silicon oxide (SiO) film that is the second inorganic film 32 is 85 nm.

The curve (heavy line) "f" shows the surface antireflection characteristic at wavelengths of 400 nm to 650 nm of a film thickness that shows a good antireflection effect for blue light and red light, for a microlens with the antireflection coating 33 formed on the surface of the embodiment. As the film thickness configuration, the film thickness of the silicon nitride (SiN) film that is the first inorganic film 31 is 135 nm and the film thickness of the silicon oxide (SiO) film that is the second inorganic film 32 is 85 nm.

The curve (heavy line) "e" shows the surface antireflection characteristic at wavelengths of 400 nm to 650 nm of a film thickness that shows a good antireflection effect for red light, for a microlens with the antireflection coating 33 formed on the surface of the embodiment. As the film thickness configuration, the film thickness of the silicon nitride (SiN) film that is the first inorganic film 31 is 120 nm and the film thickness of the silicon oxide (SiO) film that is the second inorganic film 32 is 85 nm.

The refraction index of the microlens material that is polystyrene-based resin used in this configuration is 1.61. The silicon nitride (SiN) film that is the first inorganic film 31 is formed at 180° C. to 200° C. by CVD. The refraction index of the silicon nitride (SiN) film is 1.86 in this configuration. The silicon oxide (SiO) film that is the second inorganic film 32 is formed at 180° C. to 200° C. by CVD. The refraction index of the silicon oxide (SiO) film is 1.47 in this configuration.

As described above, the film thickness configurations of the antireflection coating 33 formed of a two-layered film can decrease, for example, all of the reflection indexes lower than when only a SiO film having a thickness of 100 nm was formed as a one-layer antireflection coating on the surface of a single microlens, and can improve the sensitivity characteristics for specific colors. That is, when the sensitivity for green was improved, it is preferable to select the curve "d" or the like in FIG. 11B. That is, when the sensitivity for red and blue was improved, it is preferable to select the curve "f" or the like in FIG. 11B. When the sensitivity for red was improved, it is preferable to select the curve "e" in FIG. 11B.

In the embodiment, it is possible to adjust the sensitivity characteristics of the colors by the antireflection effect, and accordingly, it is possible to provide a solid-state imaging device having an excellent sensitivity characteristic or good color reproducibility. Further, when the antireflection coating 33 of the embodiment is combined and used with the reflection type infrared color filter described above, it is possible to reduce the reflection ratio, particularly, of the component of about 640 nm, such that it is possible to reduce the generation of a ghost as described above.

In the examined antireflection coating 33 formed of a two-layered film, a silicon nitride (SiN) film having a refraction index of 1.86 was used for the first inorganic film 31. In general, a silicon nitride (SiN) film having a refraction index of about 2.0 at a film formation temperature of about 400° C. can be formed, using an $NH_3$ gas or a $N_2$ gas when forming a silicon nitride (SiN) film. The refraction index of 1.86 is more preferable than 2.0 in the configuration of the first inorganic film 31 of the antireflection coating 33 according to the embodiment.

However, since a silicon nitride (SiN) film having a refraction index of 2.0 contains a large amount of Si—H group in the film, light transmittance is deteriorated. Further, when a film is formed at about 400° C., it is practical to use a silicon nitride (SiN) film that is formed at about 400° C., considering heat resistance of the organic films, such as a color filter, a microlens, and a color filter cover film that is described below.

For example, the temperature at which the silicon nitride (SiN) film is decreased to about 200° C. that is practical, the refraction index of the film decreases, but the organic films is not damaged.

Examination of the effect is the result of combining the silicon nitride film (SiN) with the silicon oxide film (SiO) as the antireflection coating on the microlens made of polystyrene-based resin (refraction index of about 1.61). Further, the same effect is achieved even when the microlens material is acryl-based resin (refraction index of about 1.50) or copolymer-based resin of polystyrene-based resin and acryl-based resin (refraction index of about 1.51 to 1.60). Further, a result showing a similar effect is achieved even when a silicon oxynitride (SiON) film is used as the first inorganic film, instead of the silicon nitride (SiN) film.

Further, since the second inorganic film is formed of the silicon oxycarbide (SiOC) film (refraction index of 1.4) of which the refraction index is lower than the silicon oxide (SiO) film (refraction index of 1.47), it was found that the film thickness configuration did not change and the antireflection effect was improved.

Figure 12:
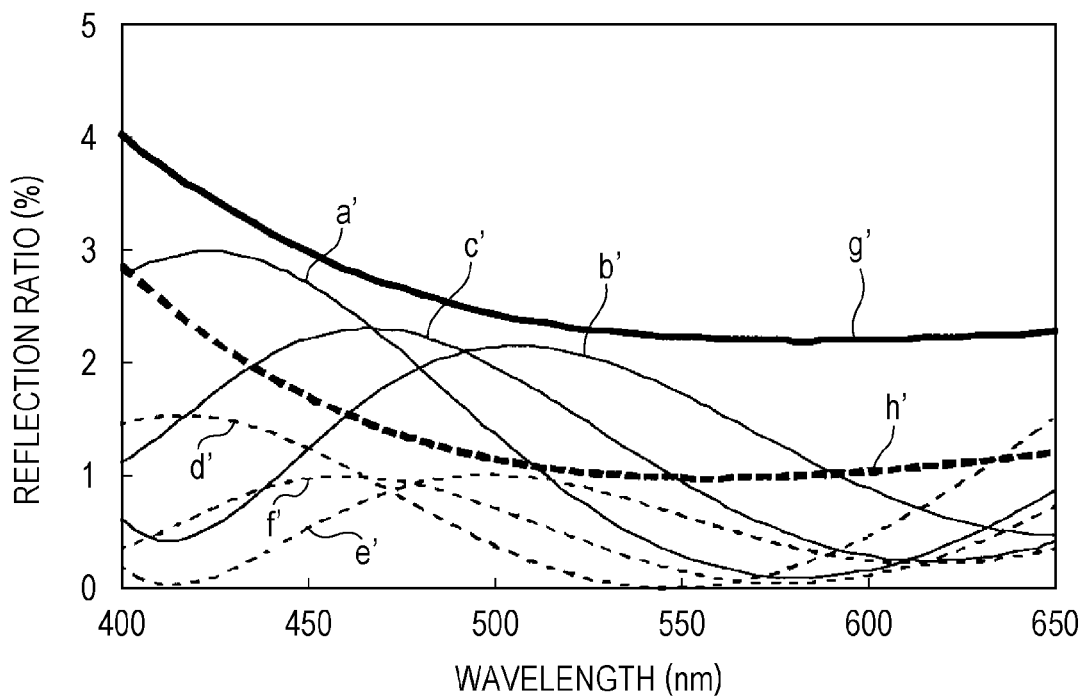
FIG. 12 is a graph of frequency-reflectance when the film thickness of a first inorganic film of an antireflection coating composed of two layers on a microlens made of polystyrene-based resin is changed.

FIG. 12 shows refraction indexes when the film thickness of a first inorganic film of a two-layered antireflection coating on a microlens made of polystyrene-based resin having a refraction index of 1.61 was changed. As sample, silicon nitride (SiN) films having a refraction index of 1.86 were formed to have thicknesses of 105 nm, 135 nm, and 120 nm, as a first inorganic film. Further, a silicon oxide (SiO) film having a refraction index of 1.47 and a silicon oxycarbide (SiOC) film having a refraction index of 1.40 were formed, as second inorganic films having a thickness of 85 mm, on each of the first inorganic films. FIG. 12 shows reflection ratios in this case.

A curve "g'" is a reflection ratio when a silicon oxide (SiO) film having a refraction index of 1.47 is formed 100 nm thick on a microlens made of polystyrene-based resin having a refraction index of 1.61. A curve "h'" is a reflection ratio when a silicon oxycarbide (SiOC) film having a refraction index of 1.40 is formed 100 nm thick on a microlens made of polystyrene-based resin having a refraction index of 1.61.

The curves "a'" to "c'" show reflection ratios when a two-layered antireflection coating was formed on a microlens made of polystyrene-based resin having a refraction index of 1.61. The first inorganic film is a silicon nitride (SiN) film having a refraction index of 1.86 and the second inorganic film is a silicon oxide (SiO) film having a refraction index of 1.47. The film thickness configurations of the first and second inorganic films are shown in Table 2.

The curves "d'" and "e'" show reflection ratios when a two-layered antireflection coating was formed on a microlens made of polystyrene-based resin having a refraction index of 1.61. The first inorganic film is a silicon nitride (SiN) film having a refraction index of 1.86 and the second inorganic film is a silicon oxycarbide (SiOC) film having a refraction index of 1.40. The film thickness configurations of the first and second inorganic films are shown in Table 2.

TABLE 2

[Unit: nm]

| | First inorganic film | Second inorganic film |
|---|---|---|
| a | 105 | 85 |
| b | 135 | 85 |
| c | 120 | 85 |
| d | 105 | 85 |
| e | 135 | 85 |
| f | 120 | 85 |

6. Sixth Embodiment

Figure 13:
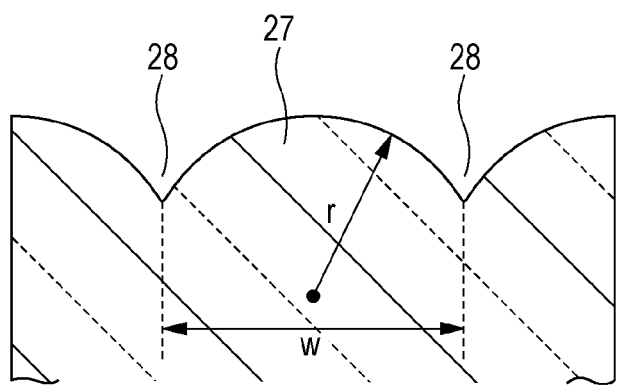
FIG. 13 is an illustrative view providing description of a microlens.

In solid-state imaging devices, sensitivity for incident light traveling at an angle is generally improved by reducing the distance from a microlens to a photodiode, as a technique for improving the sensitivity characteristic with miniaturization of pixels. When the distance from a microlens to a photodiode is reduced, it is necessary to control the radius of curvature of the microlens at a low level. However, in manufacturing of the microlenses shown in FIGS. 2 and 3 or FIGS. 6 and 7, when the gap between the microlenses is substantially made zero, as shown in FIG. 13, the limit in the radius r of curvature of the lenses was about ½ of the pixel size w.

A solid-state imaging device according to the sixth embodiment, it is possible to reduce the practical radius of curvature of a microlens by controlling the formation of the antireflection coating 33 formed of a two-layered film on the surface of the microlens 27.

[Example of Method of Manufacturing Solid-State Imaging Device as Configuration Example]

FIG. 14 shows a sixth embodiment of a solid-state imaging device according to the present disclosure. The embodiment can be applied to any one of CCD solid-state imaging devices and surface radiation type or rear surface radiation type CMOS solid-state imaging devices, because it has a characteristic in the configuration of a microlens having an antireflection coating formed of a two-layered film on the surface. FIG. 13 shows the main part of a solid-state fixing apparatus 72, that is, a microlens an antireflection coating formed of a two-layered film on a color filter, in which other configurations of the solid-state imaging device are removed.

Figure 14A:
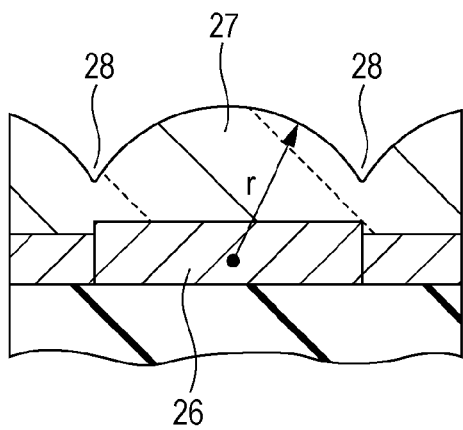
FIGS. 14A and 14B are schematic configuration views showing a sixth embodiment of a solid-state imaging device according to the present disclosure together with a schematic configuration.

In the sixth embodiment, as shown in FIG. 14A, a microlens 27 formed of an organic film is formed on a color filter 26 by an etch back process. The gap between adjacent microlenses are made substantially zero, in the microlens 27. In this configuration, a V-shaped recess 28 is formed between adjacent microlenses 27. The curved surface of the microlens 27 is formed in a substantially spherical shape.

Figure 14B:
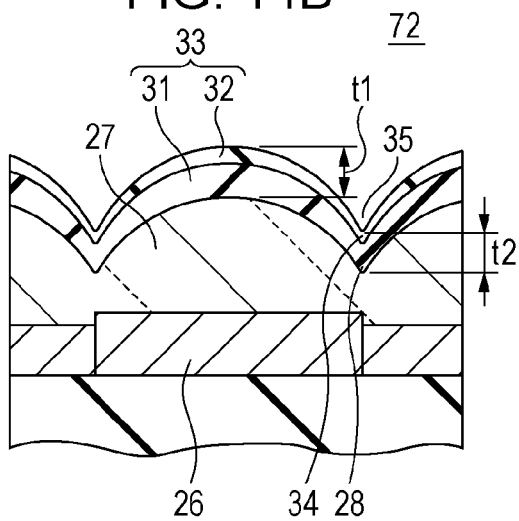

Next, as shown in FIG. 14B, an antireflection coating 33 is formed by forming two layers of films, that is, a first inorganic film 31 and a second inorganic film 32, on the surface of the microlens 27.

In this configuration, when the films are formed on the surface of a group of microlenses having a concave-convexo surface by using plasma CVD, a film formation rate is lower at the fine concave portions 28 than the convex portions. In the embodiment, the first and second inorganic films 31 and 32 are formed to further increase the development, using the difference in film formation rate between the convex portion and the concave portion 28.

That is, the first inorganic film is made of a silicon nitride (SiN) film on the surface of the microlens 27, for example, made of styrene-based resin, by plasma CVD. In this case, the first inorganic film 31 is formed at an internal pressure of a film formation chamber which is higher than a common case. In general, the internal pressure of the film formation chamber of a plasma CVD film formation apparatus is set to a low pressure of about 2 to 4 Torr such that the mean free path of the molecules in the film without generating a difference in film thickness that may be generated in the concave-convexo shape surface of the microlens group. In contrast, in the embodiment, the mean free path of the molecules in the film in the concave portion 28 is decreased by intentionally increasing the internal temperature of the film formation chamber higher than the common case, for example, controlling the internal temperature at a high pressure of 5 to 10 Torr such that the film formation rate becomes lower at the fine concave portion 28 than the convex portion. Therefore, the first inorganic film 31 having a small film thickness at the lens concave portion 28 and a large film thickness at the lens convex portion by increasing the film formation rate of the convex portion and decreasing the film formation rate of the concave portion 28, in the concave-convexo portion of the group of microlenses 27.

Next, a second inorganic film 32 is made of, for example, a silicon oxide (SiO) film under the same pressure. Accordingly, the second inorganic film 32 that is thick at the lens convex portion and thin at the lens concave portion is formed (see FIG. 14B).

Therefore, as shown in FIG. 14B, an antireflection coating 33 in which the convex portion of the microlens 27 is the thickest, that is, the film thickness t1 of the apex is the largest while the thickness t2 of the concave portion of the microlens 27 is the thinnest by reducing the thickness from the convex portion (t1>t2), thereby achieving the desired solid-state imaging device 72. The substantial lens curved surface of the microlens 27 including the antireflection coating 33, that is, the lens curved surface of the surface of the second inorganic film 32, in the solid-state imaging device 72, a concave aspheric surface.

According to the solid-state imaging device 72 according to the sixth embodiment, the lens curved surface becomes the convex aspheric surface by forming the antireflection coating 33 such that the first and second inorganic films 31 and 32 have a difference in film thickness at the convex portion and the concave potion. Therefore, it is possible to reduce the substantial focal point distance of the microlens 27, such that the distance from the microlens to the photodiode is reduced, and thus, it is possible to improve sensitivity for incident light traveling at an angle by the reduction of the distance. Accordingly, it is advantageous to decrease the pixel size of the solid-state imaging device.

Implementing the shape of the substantial lens curved surface of the microlens 27 including the antireflection coating 33 in the solid-state imaging device 72, that is, the convex aspheric surface that is the lens curved surface of the second inorganic film 32 is not limited to the forming method according to the sixth embodiment. That is, the forming method of the microlens 27 may be a forming method by the heat reflow process described above, not the etch back process described in the sixth embodiment.

Figure 15A:
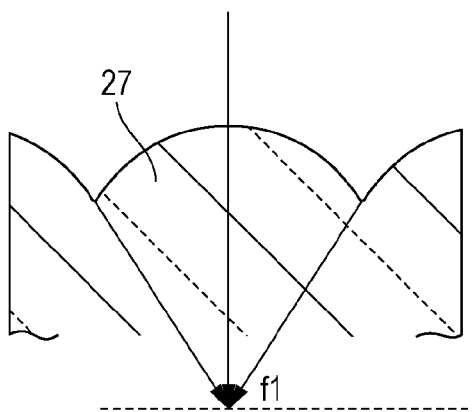
FIGS. 15A and 15B are illustrative views providing description of a microlens according to the present disclosure.
Figure 15B:
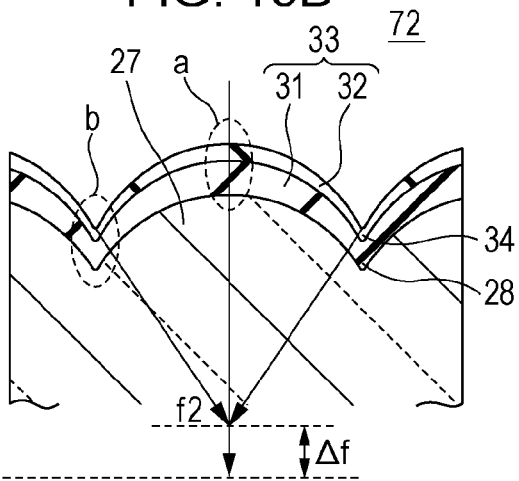

This is described in more detail by using FIG. 15. Light traveling into the microlens of a solid-state imaging device has various angles. FIG. 15A shows when incident light traveling into a microlens 27 made of an organic film, perpendicular to the cross-sectional direction, is condensed. FIG. 15B shows when incident light traveling into a substantial microlens of the sixth embodiment, which has the antireflection coating 33 formed of a two-layered film on the surface of the microlens 27, perpendicular to the cross-sectional direction, is condensed.

In FIG. 15A, the focal point distance of the microlens is f1 and the focal point distance of the microlens according to the embodiment of FIG. 15B is f2. Comparing FIG. 15A with FIG. 15B, the film thickness of the antireflection coating 33 formed of a two-layered film is large at the lens convex potion "a" and small at the lens concave portion "b", and it is possible to make the focal point distance f2 of FIG. 15B smaller than the focal point distance of FIG. 15A (f2<f1). As described above, since it is possible to reduce the distance from the microlens to the photodiode by the difference of the focal point distances Δf, it is suitable to be applied to a solid-state imaging device with an improved sensitivity characteristic and a reduced pixel size.

Figure 16:
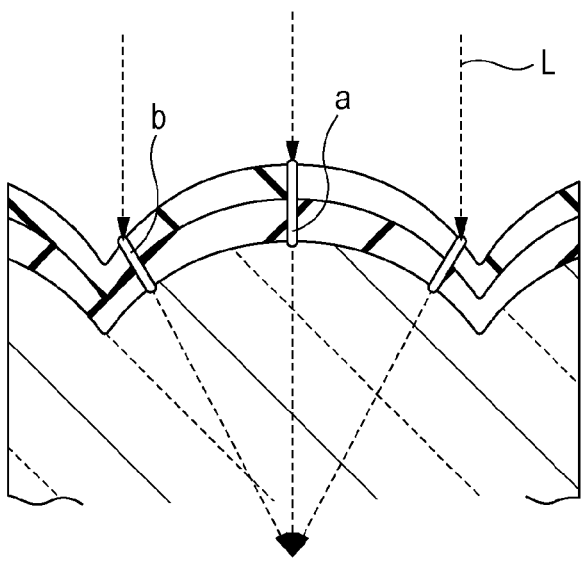
FIG. 16 is an illustrative view of a light path for incident light traveling into a microlens in the schematic view of FIG. 14B.

FIG. 16 is a view schematically showing FIG. 15B. As shown at the convex portion "a" and the concave portion "b" in FIG. 16 and FIG. 15B, considering the light path length of the light traveling into the antireflection coating 33 formed on the microlens 27, the light path length of the light L traveling into the lens concave portion "a" and the light path length of the light L traveling into the convex portion "b" are substantially the same. Therefore, the set film thickness of the antireflection coating 33 may be optimized at the lens convex portion "a". Further, since the surface reflection of the microlens is largely influenced around the lens convex portion "a" (around the center of the microlens), in the configuration of at least the antireflection coating 33, the film thickness configuration of the lens convex portion "a" may be implemented within the range shown in Table 1 and FIG. 11A.

Although it is practically ideal that the antireflection coating formed for each of the microlenses are optimized at each of the portions of the microlenses, it is practically difficult. In the solid-state imaging device 72 according to the sixth embodiment, since the antireflection effect is averaged and the focal point distance is reduced by the configuration described above, it is possible to prevent reflection from the surface of the microlens and improve the light condensing characteristic. The solid-state imaging device 72 according to the sixth embodiment can further accomplish the same effect described in the embodiment described above.

In the sixth embodiment, it may be possible to suppress the surface reflection of the microlens with the following configuration of an antireflection coating. That is, a microlens with the average effect area enlarged is formed by forming the first inorganic film 31, for example, of a SiON film having a refraction index the same as the microlens 27. Next, the antireflection coating 33 is formed by forming the second inorganic film 32, using a silicon oxide (SiO) film or a silicon oxycarbide (SiOC) film, which as a refraction index lower than a SiON film.

Although the microlens is formed by the etch back process in the sixth embodiment of FIG. 15B, it may be possible to form the antireflection coating 33 of which the film thicknesses at the lens convex portion and the lens concave portion are controlled in the same way, using the melt flow process.

As another example, it may be possible to make the refraction indexes of a microlens and a first inorganic film the same, in the configuration in which an antireflection coating composed of a first inorganic film and a second inorganic film in which the surfaces of microlenses are formed in aspheric shapes. The gap between the microlenses is not filled, in a single layer of antireflection coating. A first inorganic film made of SiN or SiON that is the same as a microlens made of SiN or SiON is embedded in the gap between the microlenses and a second inorganic film is formed of a SiO film or a SiOC film on the surface, as a single layer of antireflection coating. Even when the microlens having an aspheric surface in the configuration described above, it is possible to reduce the substantial focal point distance of the microlens and improve sensitivity for incident light traveling at an angle.

Although the sixth embodiment has the configuration without a color filter cover film, a configuration with a color filter cover film may be possible.

7. Seventh Embodiment

[Method of Manufacturing Solid-State Imaging Device as Configuration Example]

FIG. 17 shows a seventh embodiment of a solid-state imaging device according to the present disclosure. A solid-state imaging device 74 according to the embodiment has a configuration in which a color filter cover film 42 on a color filter 26 is not planarized and the distance between the apex of an on-chip microlens and a photodiode PD is reduced. The solid-state imaging device according to the embodiment can be applied to any one of CCD solid-state imaging devices and surface radiation type or rear surface radiation type CMOS solid-state imaging devices. FIG. 17 shows the main part of a solid-state fixing apparatus 74, that is, a microlens an antireflection coating formed of a two-layered film on a color filter cover film 42 and a color filter 26, in which other configurations of the solid-state imaging device are removed. Therefore, the portions corresponding to those of the embodiments described above are given the same reference numerals and a repetitive description is not provided in FIG. 17.

When acryl-based thermoplastic resin is used for the color filter cover film 42, the acryl thermoplastic resin at the four corners of the color filter corresponding to each pixel becomes thin by reducing the molar weight of acryl resin than the molar weight of resin that is substantially formed flat. That is, the surface of the acryl thermoplastic resin corresponding to the four corners of the color filter is formed at a lower position than the surface of the acryl-based thermoplastic resin formed at the center potion of the color filter 26 and the color filter cover film is not planarized and more reduced in thickness. Further, since the four corners of the color filter are formed thinner than the center portion, acryl-based thermoplastic resin is formed thin on the color filter with four thin corners by decreasing the molar weight of the resin and increasing a heat contraction rate by heat treatment.

Figure 17A:
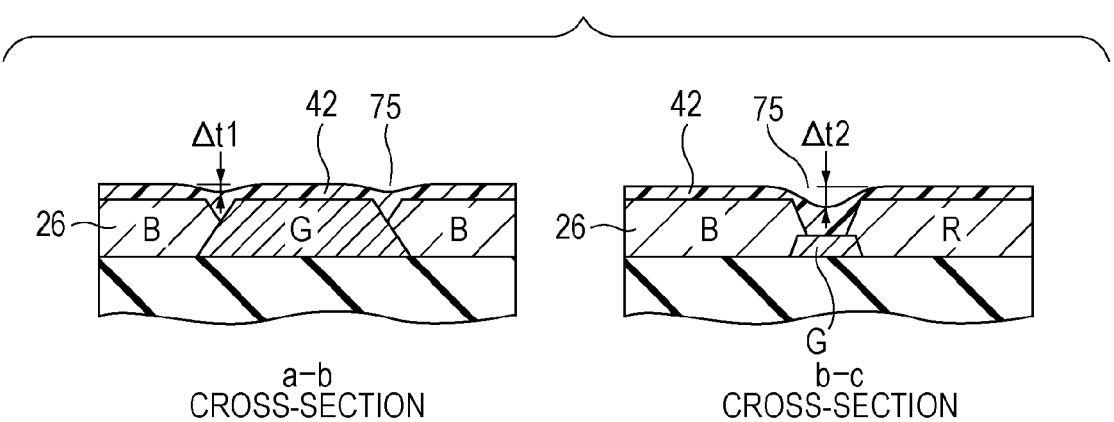
FIGS. 17A and 17B are schematic configuration views showing a seventh embodiment of a solid-state imaging device according to the present disclosure together with a schematic configuration.
Figure 17B:
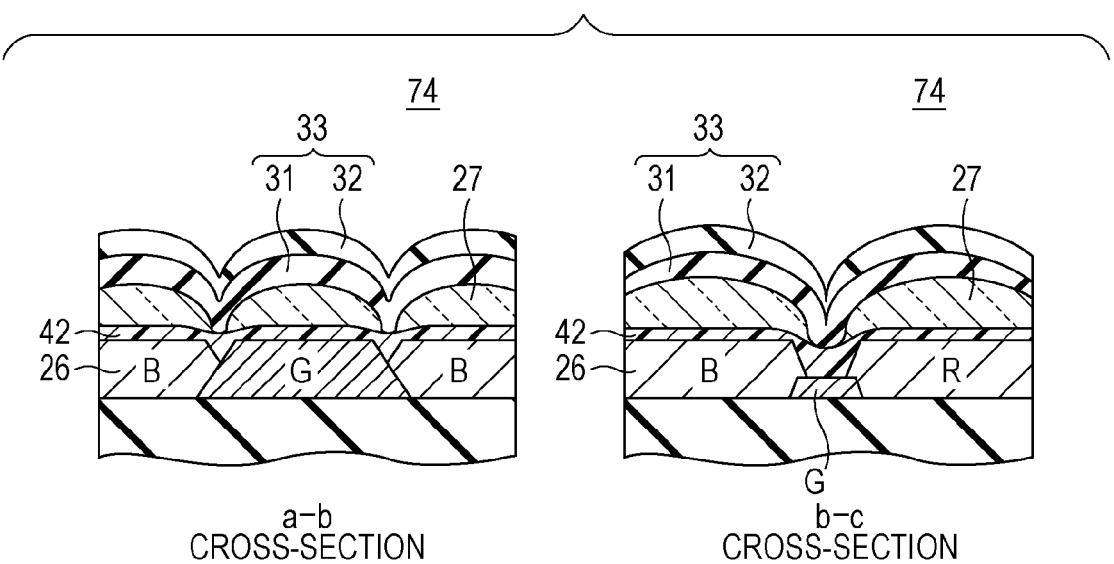
Figure 18:
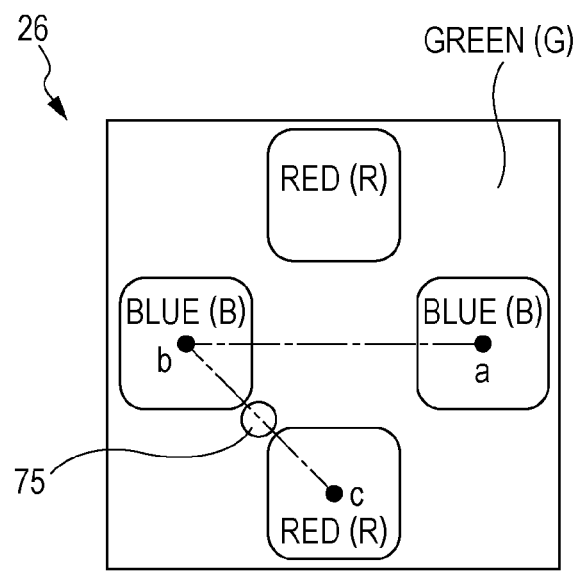
FIG. 18 is a plan view showing an example of a check-arranged color filter applied to the present disclosure.

FIG. 18 shows an example of the color filter 26. A color filter with check-arranged reds (R), greens (G), and blues (B) is used for the color filter 26. The check-arranged greens (G) are formed continuously in the diagonal direction while the reds (R) and blues (B) are arranged to be surrounded by the green (G). The left sides of FIGS. 17A and 17B show a cross-section taken along the line a-b of FIG. 18 and the right sides show a cross-section taken along the line b-c of FIG. 18.

In the seventh embodiment, as shown in FIG. 17A, the film thickness of the diagonal green (G) 75 (see FIG. 18) interposed between the red (R) and the blue (B) is larger than the other portions. The color filter cover film 42 made of, for example, acryl-based thermoplastic resin is applied with a large film thickness on the color filter 26. After the applying, the color filter cover film 42 is formed by performing heat treatment on the acryl-based thermoplastic resin. It is preferable that the acryl-based thermoplastic resin has little molar weight and in which film contraction after the heat treatment from the film thickness right after the applying (before the heat treatment) is 20% or more. Accordingly, the color filter cover film 42 is formed thin and has the concave portions 75 at the four corners of the color filter 26 corresponding to each pixel, such that it is not formed flat. The concave amount Δt2 of the concave portion 75 in the diagonal direction of the red (R), green (G), and blue (B) of the color filter 26 is larger than the concave amount Δt1 in the side direction.

Next, as shown in FIG. 17B, an antireflection coating 33 is formed by forming the microlens 27 on the color filter cover film 42 and forming two layers of films, that is, a first inorganic film and a second inorganic film, on the surface of the microlens 27. The circumferential end of the microlens is formed at the concave portion 75 of the color filter cover film 42. Accordingly, the microlens 27 is formed with the position of the bottom lower than the position of the bottom of a microlens on the planarized color filter cover film in the embodiment described above.

According to a solid-state imaging device and the manufacturing method according to the seventh embodiment, as the color filter cover film 42 is not planarized, it is possible to further reduce the thickness of the color filter cover film 42 and lower the position of the bottom of the microlens 27. Therefore, it is possible to further reduce the distance from the apex of the microlens to the photodiode PD, the light condensing characteristic is improved, and the sensitivity characteristic can be improved. Further, since the concave portion 75 of the color filter cover film 42 has a lens operation, a non-lens area is not formed at the interface of adjacent microlenses. Further, since the antireflection coating formed of two-layered film is included, the same effect as that of the embodiment described above is accomplished.

An antireflection coating having an aspheric surface of the sixth embodiment may be used for the antireflection coating 33 formed of a two-layered film of the seventh embodiment.

Further, the color filter cover film may be made of acryl-based thermoset resin, in non-flat shape. Thermoplastic resin is suitable for forming the color filter cover film, entirely thick and flat.

It is preferable that the surface state of the second inorganic film 32 at uppermost portion has hydrophilicity, in the antireflection coating 33 formed of a two-layered film. This is for avoiding a problem of sticking of particles, when dicing is performed from a wafer state into a chip state, although a wafer is cut by a dicer while water flows.

In the antireflection coating 33 formed of a two-layered film according to the embodiments, the surface has hydrophilicity when the second inorganic film 32 is a silicon oxide (SiO) film, such that particles does not stick in dicing. Further, when SiH (CH$_3$)$_3$ is used as a film formation gas, CH$_3$ group exists in the surface of a silicon oxycarbide (SiOC) film, such that eh surface has hydrophobicity. When a SiOC film is used for the second inorganic film 32, the surface has hydrophilicity by applying a plasma process (light ashing) on the surface by using an oxygen gas or the like before cutting a wafer.

An example of film formation conditions of the antireflection coating 33 according to the embodiment is sequentially shown.

(1) Silicon nitride (SiN) film
Gas: SiH$_4$, NH$_3$, N$_2$
Temperature: about 200° C.
Pressure: about 2 to 4 Torr (generally)
Pressure: about 5 to 10 Torr when the mean free path of particles reduces (2) Silicon oxide (SiO) film
Gas: SiH$_4$, NH$_3$, N$_2$O, N$_2$
Temperature: about 200° C.
Pressure: about 2 to 4 Torr (generally)
Pressure: about 5 to 10 Torr when the mean free path of particles reduces (3) Silicon oxide (SiO) film
Gas: SiH$_4$, N$_2$O
Temperature: about 200° C.
Pressure: about 2 to 4 Torr (generally)
Pressure: about 5 to 10 Torr when the mean free path of particles reduces (4) Silicon oxycarbide (SiOC) film
Gas: SiH (CH$_3$)$_3$, O$_2$, He
Temperature: about 200° C.
Pressure: about 2 to 4 Torr (generally)
Pressure: about 5 to 10 Torr when the mean free path of particles reduces In the solid-state imaging devices according to the embodiments described above, the first conductive type is implemented in the p-type and the second conductive type is implemented in the n-type, with the signal charges as electrons, but the present disclosure may be applied to a solid-state imaging device using signal charges as holes. In this case, the n-type is the second conductive type and the p-type is the first conductive type.

8. Eighth Embodiment

[Configuration Example of Electronic Apparatus]

The solid-state imaging device according to the disclosure described above may be applied to a camera system, such as a digital camera or a video camera, electronic apparatuses, such as a mobile phone having an imaging function or other apparatuses having an imaging function.

Figure 19:
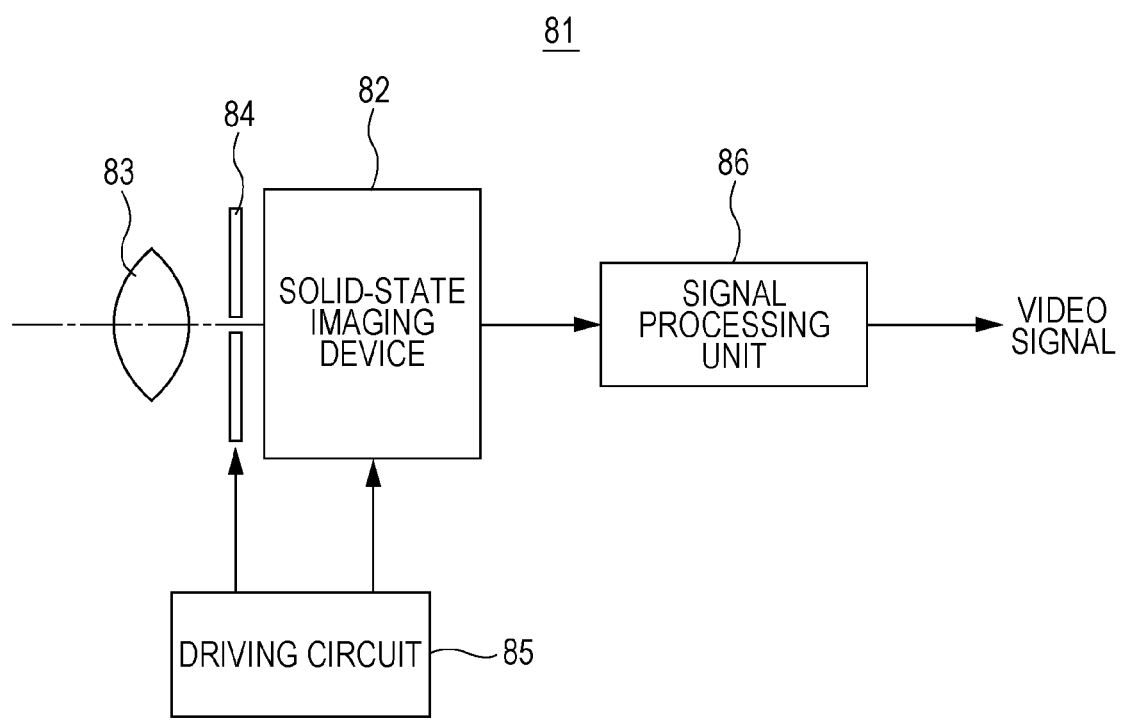
FIG. 19 is a schematic cross-sectional configuration view showing the main parts of a solid-state imaging device according to an eighth embodiment of the present disclosure.
Figure 20:
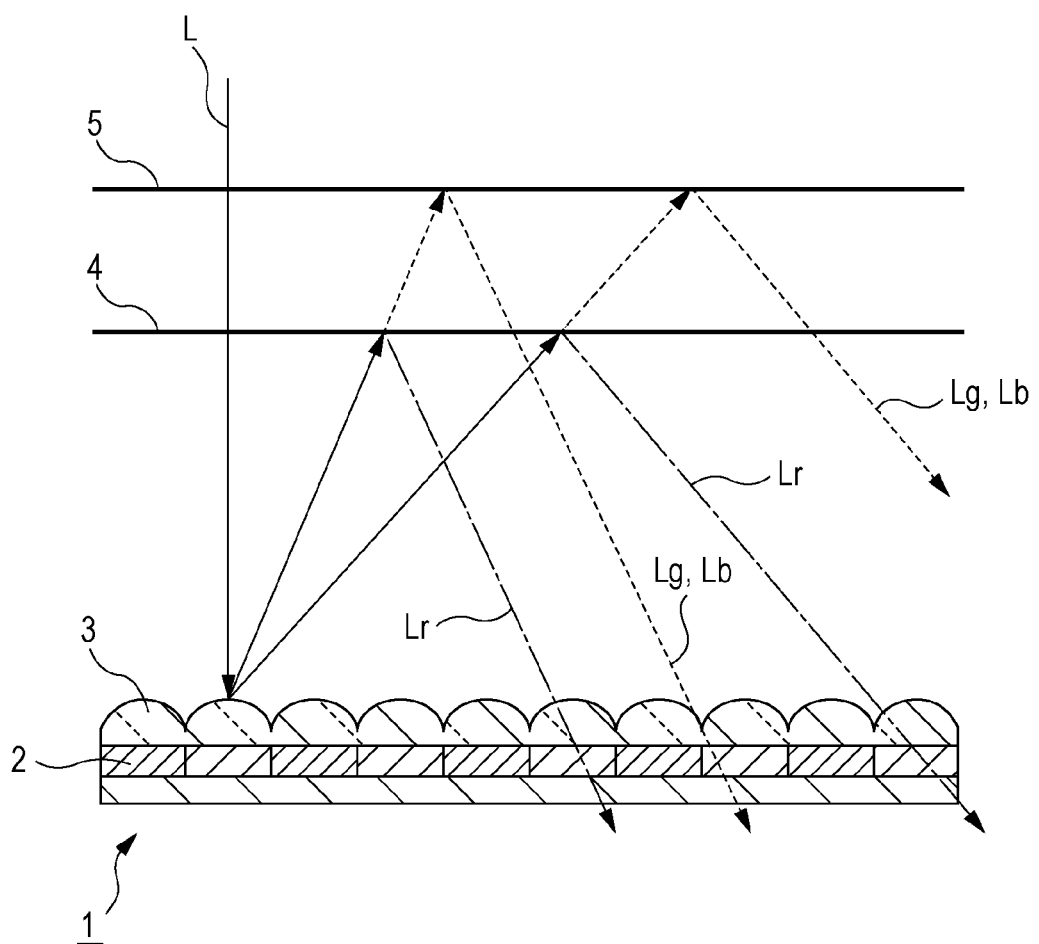
FIG. 20 is an illustrative view illustrating a mechanism of generating a ghost in a solid-state imaging device.

FIG. 19 shows the seventh embodiment equipped with a camera as an example of an electronic apparatus according to the present disclosure. The camera according to the embodiment is a digital camera that can take static images or video, as an example. A camera 81 of the embodiment includes a solid-state imaging device 82, an optical system 83 that introduces incident light to a light receiving sensor of the solid-state imaging device 82, a shutter mechanism 84, a driving circuit 85 that drives the solid-state imaging device 82, and a signal processing circuit 86 that processes an output signal of the solid-state imaging device 82.

The solid-state imaging device 82 may be any one of the solid-state imaging devices of the embodiments described above.

The optical system (optical lens) 83 forms an image on an image surface of the solid-state imaging device 82, using image light (incident light) from an object. Accordingly, signal charges are accumulated for a predetermined period of time in the solid-state imaging device 82.

The optical system 83 may be an optical lens system composed of a plurality of optical lenses. The shutter mechanism 84 controls periods of radiating and blocking light traveling to the solid-state imaging device 82. The driving circuit 85 supplies a driving signal for controlling a transferring operation of the solid-state imaging device 82 and a shutting operation of the shutter mechanism 84. Signal transmission of the solid-state imaging device 82 is performed by the driving signal (timing signal) supplied from the driving circuit. The signal processing unit 86 performs various signal processing. A video signal that has undergone the signal processing is stored in a storing medium, such as a memory, or output to a monitor.

According to the electronic apparatus of the seventh embodiment, in the solid-state imaging device, since the microlens 27 having the antireflection coating 33 is included, it is possible to reduce the generation of a ghost due to surface reflection of the microlens 27, improve the sensitivity characteristic, and prevent the generation of corrugation. Therefore, it is possible to achieve a high-sensitivity and good-quality image and provide a high-quality electronic apparatus.

For example, it is possible to provide a high-quality camera.

The present disclosure contains subject matter related to that disclosed in Japanese Priority Patent Application JP 2010-227755 filed in the Japan Patent Office on Oct. 7, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels formed on a semiconductor substrate and including a photoelectric conversion unit;
a color filter on the pixels;
an on-chip microlens made of an organic film on the color filter, corresponding to each of the pixels;
first inorganic films formed on a surface of the on-chip microlens and having a higher refraction index than the on-chip microlens; and
second inorganic films formed on a surface of the first inorganic film and having a lower refraction index than the on-chip microlens and the first inorganic film,
wherein,
adjacent first inorganic films are in contact with each other at an interface between adjacent first inorganic films,
adjacent second inorganic films have a V-shaped recess in-between adjacent on-chip lenses such that the ends of adjacent second inorganic films are in contact with each other,
at an interface between adjacent second inorganic films, and
the on-chip microlens area is continuous between adjacent first inorganic films.

2. The solid-state imaging device according to claim 1, wherein the first inorganic film is formed of a silicon nitride film or a silicon oxynitride film and the second inorganic film is formed of a silicon oxide film or a silicon oxycarbide film.

3. The solid-state imaging device according to claim 1, wherein a lower organic film that is in contact with the first inorganic film is thermoplastic resin and the film thickness of the first inorganic film is 450 nm or less.

4. The solid-state imaging device according to claim 1, wherein a lower organic film that is in contact with the first inorganic film is thermoplastic resin and the first inorganic film is a silicon oxynitride film.

5. The solid-state imaging device according to claim 4, wherein the lower layer made of thermoplastic resin in contact with the first inorganic film is a color filter cover film that is exposed between adjacent on-chip microlenses.

6. The solid-state imaging device according to claim 1, wherein the color filter cover film on the color filter is not planarized.

7. The solid-state imaging device according to claim 1, wherein the total film thickness of the first and second inorganic film is set such that the thickness of a concave portion corresponding to the interface of adjacent second inorganic films than that of the pex of the on-chip microlens, and the surface of the second inorganic film is formed in an aspheric surface.

8. The solid-state imaging device according to claim 1, wherein the pixel includes the photoelectric conversion unit, and a plurality of pixel transistors and the solid-state imaging device is a CMOS solid-state imaging device.

9. The solid-state imaging device according to claim 1, wherein the pixel includes the photoelectric conversion unit and a transfer unit corresponding to the photoelectric conversion unit of a vertical transfer resistor, and the solid-state imaging device is a CCD solid-state imaging device.

10. An electronic apparatus comprising:
a solid-state imaging device;
an optical system that introduces incident light to a photoelectric conversion unit of the solid-state imaging device; and
a signal processing circuit that processes an output signal of the solid-state imaging device,
wherein,
the solid-state imaging device comprises (a) a plurality of pixels formed on a semiconductor substrate and including a photoelectric conversion unit, (b) a color filter on the pixels, (c) an on-chip microlens made of an organic film on the color filter, corresponding to each of the pixels, (d) a first inorganic films formed on a surface of the on-chip microlens and having a higher refraction index than the on-chip microlens, and (e) second inorganic films formed on a surface of the first inorganic film and having a lower refraction index than the on-chip microlens and the first inorganic film, and
adjacent first inorganic films are in contact with each other at an interface between adjacent first inorganic films,
adjacent second inorganic films have a V-shaped recess in-between adjacent on-chip lenses such that the ends of adjacent second inorganic films are in contact with each other at an interface between adjacent second inorganic films, and
the on-chip microlens area is continuous between adjacent first inorganic films.

* * * * *